US008842492B2

(12) United States Patent
Shaeffer et al.

(10) Patent No.: US 8,842,492 B2
(45) Date of Patent: Sep. 23, 2014

(54) MEMORY COMPONENTS AND CONTROLLERS THAT UTILIZE MULTIPHASE SYNCHRONOUS TIMING REFERENCES

(75) Inventors: Ian Shaeffer, Los Gatos, CA (US); Frederick A. Ware, Los Altos Hills, CA (US); Scott C. Best, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 8 days.

(21) Appl. No.: 13/823,866

(22) PCT Filed: Nov. 19, 2011

(86) PCT No.: PCT/US2011/061564
§ 371 (c)(1),
(2), (4) Date: Mar. 15, 2013

(87) PCT Pub. No.: WO2012/078341
PCT Pub. Date: Jun. 14, 2012

(65) Prior Publication Data
US 2013/0208818 A1    Aug. 15, 2013

Related U.S. Application Data

(60) Provisional application No. 61/421,396, filed on Dec. 9, 2010.

(51) Int. Cl.
*G11C 8/00* (2006.01)
*H04L 25/40* (2006.01)
*G06F 13/00* (2006.01)
*G11C 7/22* (2006.01)

(52) U.S. Cl.
CPC H04L 25/40 (2013.01); G11C 7/22 (2013.01); G06F 13/00 (2013.01)
USPC .................. 365/233.13; 365/233.11

(58) Field of Classification Search
USPC ..................................................... 365/233.13
See application file for complete search history.

(56) References Cited

U.S. PATENT DOCUMENTS

| 5,034,964 A | 7/1991 | Khan et al. |
| 6,279,090 B1 | 8/2001 | Manning |
| 6,854,042 B1 | 2/2005 | Karabatsos |

(Continued)

OTHER PUBLICATIONS

IDT71T6280H IDT 9Mb (512K×18-Bit) Pipelined SRAM with QDR™ SRAM Burst of 2, Cypress Semiconductor, IDT, Inc. and Micron Technology, Feb. 2000, Advance Information commercial Termperature Range. 17 Pages.

(Continued)

*Primary Examiner* — Son Mai
(74) *Attorney, Agent, or Firm* — The Neudeck Law Firm, LLC

(57) ABSTRACT

Multiple timing reference signals (e.g., clock signals) each cycling at the same frequency are distributed in a fly-by topology to a plurality of memory devices in various embodiments are presented. These multiple clock signals each have a different phase relationship to each other (e.g., quadrature). A first circuit receives a first of these clocks as a first timing reference signal. A second circuit receives a second of these clocks as a second timing reference signal. A plurality of receiver circuits receive signals synchronously with respect to the first timing reference signal and the second timing reference signal, such that a first signal value is resolved using the first timing reference signal and a second signal value is resolved using the second timing reference signal.

20 Claims, 19 Drawing Sheets

(56) References Cited

U.S. PATENT DOCUMENTS

| | | | |
|---|---|---|---|
| 6,940,782 | B2 | 9/2005 | Matsui |
| 7,003,684 | B2* | 2/2006 | Chang .......................... 713/500 |
| 7,032,092 | B2* | 4/2006 | Lai .............................. 711/167 |
| 7,269,094 | B2* | 9/2007 | Lin et al. .................. 365/233.14 |
| 7,612,621 | B2 | 11/2009 | Kim et al. |
| 7,683,725 | B2 | 3/2010 | Kim et al. |
| 8,242,819 | B2* | 8/2012 | Bae et al. ...................... 327/156 |
| 2006/0143491 | A1 | 6/2006 | Lin et al. |
| 2007/0002676 | A1 | 1/2007 | McCall et al. |
| 2007/0206428 | A1 | 9/2007 | Bae et al. |
| 2009/0251987 | A1 | 10/2009 | Macri |
| 2010/0103746 | A1 | 4/2010 | Ma |
| 2010/0135100 | A1 | 6/2010 | Chiu |

OTHER PUBLICATIONS

International Preliminary Report on Patentability (Chapter I) dated Jun. 20, 2013 in International Application No. PCT/US2011/061564. 8 pages.

International Search Report and Written Opinion mailed Apr. 10, 2012 re Int'l Application No. PCT/US11/061564. 12 pages.

Karabatsos, C., "Quad Band Memory (QBM) Technology", Kentron Technologies, Inc., Apr. 2001.

Kentron Technologies, Inc., "Quad Band Memory (QBM)," "The 'QBM Enabled' Via PT880/PM880 Chipset Solutions with the Fastest Memory," published Jul. 21, 2003. 12 pages.

Wang et al., "A 500-Mb/s quadruple data rate SDRAM interface using a skew cancellation technique," Apr. 2001, IEEE Journal of Solid-State Circuits, pp. 648-657, vol. 36, No. 4. 10 pages.

Kim et al., "A 500MB/s/Pin Quadruple Data Rate SDRAM Interface using a Skew Cancellation Technique," Feb. 9, 2000, 2000 IEEE International Solid-State Circuits Conference, Digest of Technical Papers. 3 pages.

Kim, Kyu-Hyoun, Sohn, Young-Soo, Kim Chan-Kyoung, Park, Moonsook, Lee, Dong-Jin, Kim, Woo-Seop, Kim Changhyun, "A 20-Gb/s 256-Mb DRAM With an Inductorless Quadrature PLL and a Cascaded Pre-emphasis Transmitter", IEEE Jouranl of Solid-State Circuits, vol. 41, No. 1, Jan. 2006. pp. 127-134.

Kim, Kyu-Hyoun; Sohn, Young-Soo; Kim, Chan-Kyoung; Lee, Dong-Jin; Byun, Gyung-Su; Lee, Noon; Lee, Jae-Hyoung; Sunwoo, Jung; Choi, Jung-Hwan; Chai, Jun-Wan; Kim, Changhyun; Cho, Soo-In. "A 20GB/s 256Mb DRAM with an Inductorless Quadrature PLL and a Cascaded Pre-emphasis Transmitter", 2005 IEEE International Solid-State Circuits Conference, Hwasung, Korea; pp. 470-471.

QBM Alliance, Platform Conference, Quad Band Memory: DDR 200/266/333 devices producing DDR400/533/667, Jan. 23-24, 2002. 33 pages.

* cited by examiner

MEMORY COMPONENTS AND CONTROLLERS THAT UTILIZE MULTIPHASE SYNCHRONOUS TIMING REFERENCES

TECHNICAL FIELD

The present disclosure relates generally to information storage and retrieval and, more particularly, to coordinating the transfer of data and/or control signals between memory system components.

DETAILED DESCRIPTION

Figure 1:
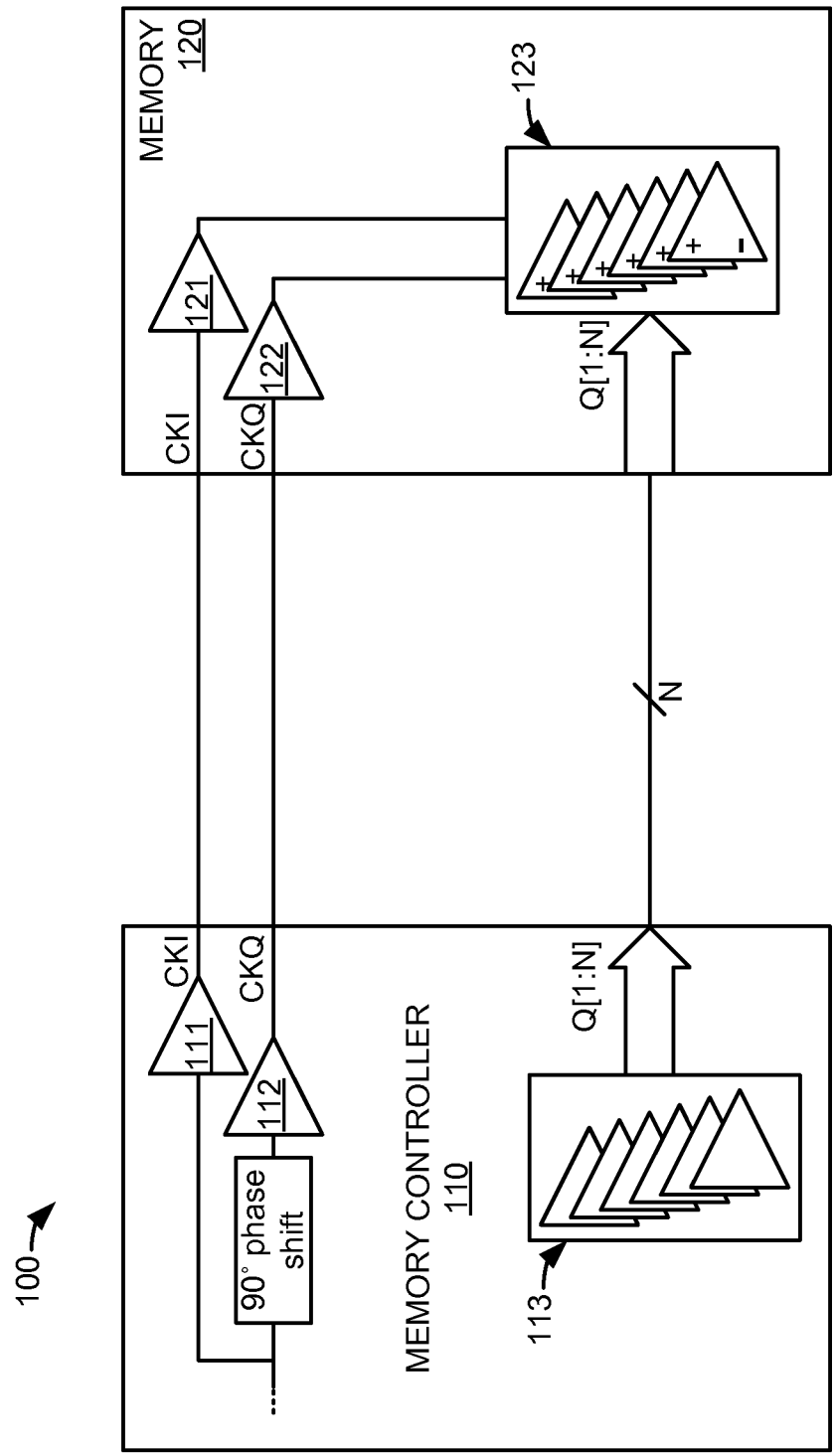
FIG. 1 is a block diagram illustrating a memory system.

Various embodiments described herein relate to a system including integrated circuit devices, for example, memory devices and/or at least a memory controller device that controls such memory devices (and methods of operation of these respective devices). In several embodiments, as is described in more detail below, a multiphase timing reference (e.g., quadrature clocks) is incorporated to orchestrate the transfer of data, and/or commands that specify memory operations, between memory devices and controller devices.

In a specific embodiment, at least two timing reference signals are provided, in a system, to one or more memory devices. The timing reference signals are the same frequency, but one is delayed from the other by approximately ¼ of a cycle. Thus, the two timing reference signals have a quadrature phase relationship or are "in quadrature." In an embodiment, the timing reference signals are distributed to multiple memory devices in a "fly-by" topology. A fly-by topology is different than a "star" or "T" topology. In a star or T topology, the signals are routed to arrive at all of the memory devices at substantially the same time. In the case of the fly-by topology, signals are routed such that they arrive at a first device, then a next device, then the next, etc., in sequence or serial-like fashion. Accordingly, the flight times of these timing reference signals from the clock source to each of the memory devices are skewed, and thus different.

Heavily loaded signal lines routed in a fly-by topology have a frequency response from source to destination similar to a low-pass filter. In an embodiment, distributing two lower frequency quadrature timing reference (a.k.a., one of clock or strobe) signals allows these lower frequency timing reference signals to arrive at each of the destination memory devices with more amplitude than a single timing reference signal being sent at twice the frequency. Because there are two edges for each of the two quadrature timing references per cycle, and those edges are not aligned between one timing reference signal relative to another timing reference signal, the quadrature timing references define four instants (or periods) per cycle which may be used to synchronize signals into, or out of, a memory device. A signal may be clocked in (or out) of a device by each edge of both of the timing references. Thus, distributing two timing references in quadrature enables signals to be clocked in/out of devices at four times the frequency of the individual timing reference signal, while adequate signal strength of the timing reference signals is maintained upon arriving at the devices.

In another embodiment, the concept of multiple timing references toggling at the same frequency, but having unique phase offsets relative to one another, is extended to more than two timing reference signals. Multiple timing reference signals each cycling at the same frequency are distributed in a fly-by topology to each of the memory devices. These multiple timing reference signals each have a different phase relationship relative to each other. In other words, taking a first timing reference signal as a reference, a second timing reference signal would be delayed from the first clock signal by approximately $1/(2*M)$ of the timing reference signal cycle time, where M is the total number of timing reference signals distributed. A third timing reference signal would be delayed from the first by approximately $2/(2*M)$, a fourth $3/(2*M)$, etc. In an embodiment, distributing M timing references in this multiphase relationship enables signals to be clocked in/out of devices at $2*M$ times the frequency of the individual timing references, while maintaining an adequate signal strength of the timing reference signals arriving at the devices.

FIG. 1 is a block diagram illustrating an embodiment of a memory system. In FIG. 1, memory system 100 comprises memory controller 110 and memory 120. Memory controller 110 includes driver 111, driver 112, and drivers 113. Memory controller 110 also includes timing reference ports CKI and CKQ that are driven by driver 111 and driver 112, respectively. Memory controller 110 also includes N number of signal ports Q[1:N] that are driven by drivers 113. Memory controller 110 may also include receivers (not shown in FIG. 1) for receiving signals from memory 120 via the Q[1:N] signal ports. Memory 120 includes receiver 121, receiver 122, and receivers 123. Timing reference ports CKI and CKQ of memory controller 110 are operatively coupled to memory 120 ports CKI and CKQ, respectively. Signal ports Q[1:N] of memory controller 110 are operatively coupled to ports Q[1:N] of memory 120, respectively. Thus, receiver 121 and receiver 122 of memory 120 receive the CKI and CKQ signals, respectively, from memory controller 110. Receiver 121 and receiver 122 of memory 120 generate internal clocks or strobes derived from the CKI and CKQ signals, respectively, from memory controller 110. Receivers 123 of memory 120 receive the Q[1:N] signals from memory controller 110. Memory 120 may also include drivers (not shown in FIG. 1) for driving signals to memory controller 110 via the Q[1:N] signal ports.

Memory controller 110 and memory 120 are integrated circuit type devices, such as one commonly referred to as a "chip". A memory controller, such as memory controller 110, manages the flow of data going to and from memory devices, such as memory 120. For example, a memory controller may be a northbridge chip, an application specific integrated circuit (ASIC) device, a graphics processor unit (GPU), a system-on-chip (SoC) or an integrated circuit device that includes many circuit blocks such as ones selected from graphics cores, processor cores, and MPEG encoder/decoders, etc. Memory 120 can include a dynamic random access memory (DRAM) core or other type of memory cores, for example, static random access memory (SRAM) cores, or non-volatile memory cores such as flash. In addition although the embodiments presented herein describe memory controller and components, the instant apparatus and methods may also apply to chip interfaces that effectuate signaling between separate integrated circuit devices.

It should be understood that signal ports Q[1:N] of both memory controller 110 and memory 120 may correspond to any input or output pins (or balls) of memory controller 110 or memory 120 that rely on timing reference signals communicated via timing reference ports CKI and CKQ for synchronization. For example, signal ports Q[1:N] can correspond to bidirectional data pins (or pad means) used to communicate read and write data between memory controller 110 and memory 120. The data pins may also be referred to as "DQ" pins. Thus, for a memory 120 that reads and writes data up to 16 bits at a time, signal ports Q[1:N] can be seen as corresponding to pins DQ[0:15]. In another example, signal ports Q[1:N] can correspond to one or more unidirectional command/address (C/A) bus. Signal ports Q[1:N] can correspond to one or more unidirectional control pins. Thus, signal ports Q[1:N] on memory controller 110 and memory 120 may correspond to pins such as CS (chip select), a command interface that includes timing control strobes such as RAS and CAS, address pins A[0:P] (i.e., address pins carrying address bits), DQ[0:X] (i.e., data pins carrying data bits), etc., and other pins in past, present, or future devices.

In an embodiment, the signals output by timing reference ports CKI and CKQ are periodic at a stable frequency and have a quadrature phase relationship to each other. Because CM and CKQ are periodic, CKI and CKQ may be referred to as clock signals (and thus drivers 111 and 112 may be referred to as clock drivers; receivers 121 and 122 may be referred to as clock receivers). The sent (and received) signal values on CKI and CKQ per approximately ¼ of each CKI cycle is given in table 1. In another embodiment, the signals output by timing reference ports CKI and CKQ may be one of respective intermittent clock signals or strobe signals that maintain a quadrature relationship to each other. In this embodiment, because CKI and CKQ are strobes, drivers 111 and 112 may be referred to as strobe drivers and receivers 121 and 122 may be referred to as strobe receivers.

TABLE 1

| Part of cycle | CKI | CKQ |
| --- | --- | --- |
| 1$^{st}$ quarter cycle | 0 | 0 |
| 2$^{nd}$ quarter cycle | 1 | 0 |
| 3$^{rd}$ quarter cycle | 1 | 1 |
| 4$^{th}$ quarter cycle | 0 | 1 |

Note that each of the quarter cycles given in Table 1 involve a unique combination of CKI and CKQ. Thus, the states of CKI and CKQ, or the transitions between these states, can be used as timing references to control the transmission or reception of other signals, such as Q[1:N], at a rate that is 4 times the cycle time of CKI and CKQ.

Figure 2:
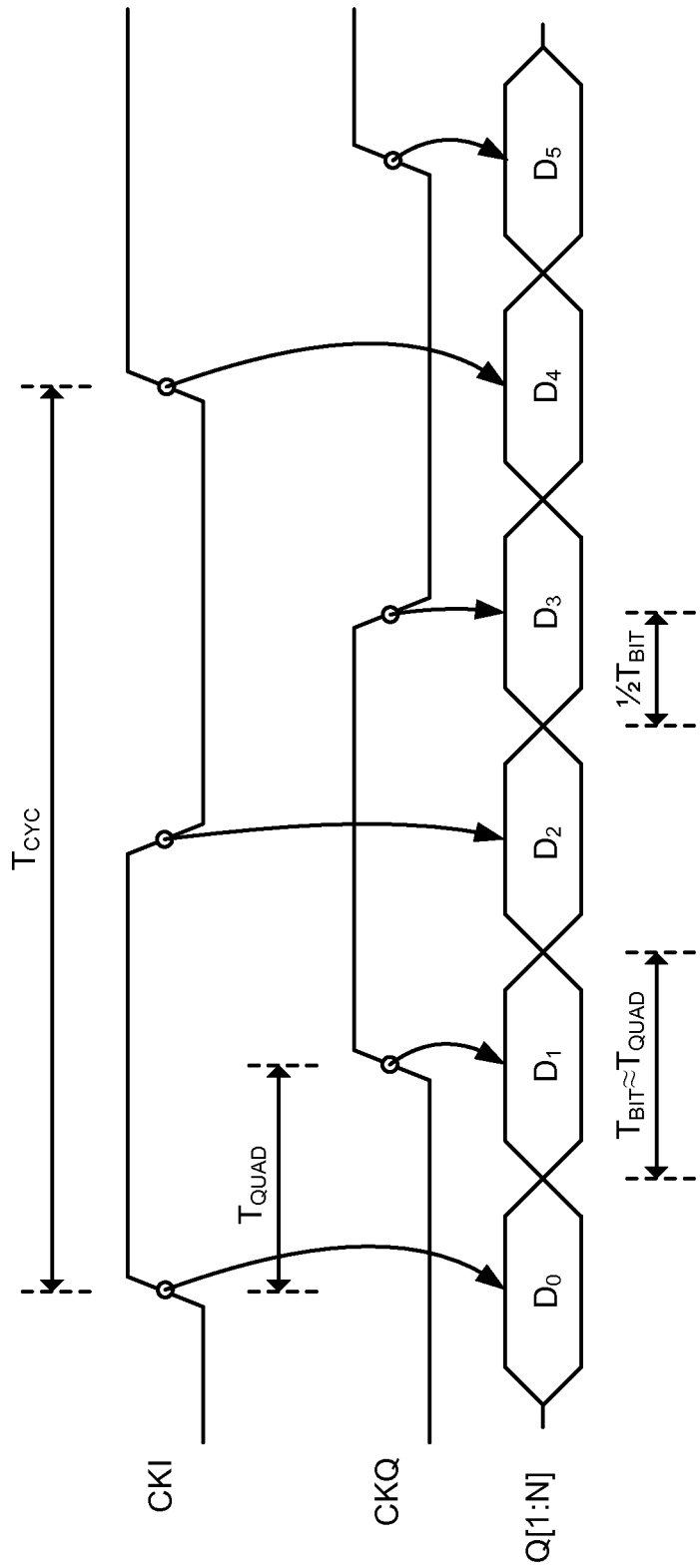
FIG. 2 is a timing diagram illustrating quadrature timing references used to receive signals.

FIG. 2 is a timing diagram illustrating quadrature timing references used to receive signals. The signals and timing illustrated in FIG. 2 may correspond to signals and timing of memory system 100 (shown in FIG. 1). In particular, the signals and timing illustrated in FIG. 2 may correspond to the signals and timing received by memory 120. In FIG. 2, CKI is shown periodically cycling with a period of $T_{CYC}$ (i.e., a frequency of $1/T_{CYC}$). CKQ is likewise shown cycling with a period of $T_{CYC}$. CKQ is shown delayed from CKI by $T_{QUAD}$. $T_{QUAD}$ is shown as approximately ¼ of $T_{CYC}$ (also known as a 90° phase shift).

At the start of the timing diagram in FIG. 2, CKI and CKQ are both shown at a logic low. This corresponds to the first quarter cycle given in Table 1. A first rising edge of CKI is shown at a time when CKQ remains low. After CKI has risen, CKI is high and CKQ is low. Thus, this corresponds to the second quarter cycle shown in Table 1. The first rising edge of CKI in FIG. 2 is shown corresponding to roughly a midpoint of data $D_0$ on signals Q[1:N]. This may correspond, for example, to the arrival, as sent by memory controller 110, of the rising edge of CKI and a stable signal eye of the data $D_0$ at the receivers of memory 120. The rising edge of CM may be used to sample (or resolve) the $D_0$ signal values at the pins of memory 120. In another embodiment, an immediately preceding falling edge of CKQ and the rising edge of CKI may be used to define a time interval over which the $D_0$ signals at the pins of memory 120 are integrated to resolve the $D_0$ signal values.

At a time $T_{QUAD}$ after the first rising edge of CKI, a first rising edge of CKQ is shown. After CKQ has risen, CKI is high and CKQ is high. Thus, this corresponds to the third quarter cycle shown in Table 1. The first rising edge of CKQ is shown corresponding to roughly a midpoint of data $D_1$ on signals Q[1:N]. This may correspond, for example, to the arrival, as sent by memory controller 110, of the rising edge of CKQ and a stable signal eye of the data $D_1$ at the receivers of memory 120. The rising edge of CKQ may be used to sample (or resolve) the $D_1$ signal values at the receivers of memory 120. In another embodiment, the immediately preceding rising edge of CKI and the rising edge of CKQ may be used to define a time interval over which the $D_1$ signals at the pins of memory 120 are integrated to resolve the $D_1$ signal values.

At a time approximately $T_{QUAD}$ after the first rising edge of CKQ, a falling edge of CKI is shown. After CKI has fallen, CKI is low and CKQ is high. Thus, this corresponds to the fourth quarter cycle shown in Table 1. The falling edge of CKI is shown corresponding to roughly a midpoint of data $D_2$ on signals Q[1:N]. As discussed previously, the edges (either rising or falling, as appropriate) of CKI and/or CKQ may be used to integrate, sample, or both the signals at the receivers of memory 120 in order to resolve the signal values $D_2$ on ports Q[1:N]. At a time approximately $T_{QUAD}$ after the falling edge of CKI, a falling edge of CKQ is shown. The falling edge of CKQ is shown corresponding to roughly a midpoint of data $D_3$ on signals Q[1:N]. After the falling edge of CKQ, it should be noted that both CKI and CKQ are low. Thus, this corresponds to the first quarter cycle shown in Table 1. Again, the edges of CKI and/or CKQ may be used to resolve the signal values $D_3$ on ports Q[1:N].

A second rising edge of CKI is shown at approximately $T_{QUAD}$ after the falling edge of CKQ. The second rising edge of CKI is shown corresponding to roughly a midpoint of data $D_4$ on signals Q[1:N]. A second rising edge of CKQ is shown at approximately $T_{QUAD}$ after the second rising edge of CKI. The second rising edge of CKQ is shown corresponding to roughly a midpoint of data $D_5$ on signals Q[1:N].

As can be seen in FIG. 2, the rising and falling edges of CKI and CKQ each occur approximately $T_{QUAD}$ apart from a rising or falling edge of the other signal. Because the edges (both rising and falling) are unique in time from the edges of the other timing reference signal, the transitions of CKI and CKQ may be used as timing references to capture the signals being received on Q[1:N] at a rate that is 4 times $T_{CYC}$. The signals can be received on Q[1:N] at a rate that is 4 times $T_{CYC}$, even though the individual timing reference signals CKI and CKQ are only cycling at a frequency of $1/T_{CYC}$.

Because the rising and falling edges of CKI and CKQ occur approximately $T_{QUAD}$ apart, the bit time ($T_{BIT}$) for a particular signal value (e.g., $D_0$, $D_1$, etc.) is also approximately $T_{QUAD}$. This is illustrated in FIG. 2 showing the time interval $T_{BIT} \approx T_{QUAD}$ between midpoints of the transitions on Q[1:N]. The edges of CKI and CKQ are shown to align with the midpoint (i.e., $\frac{1}{2}T_{BIT}$ into the bit time) of each particular signal value.

In an embodiment, sampling receivers may use the edges of CKI and CKQ to capture the signal values on Q[1:N] into either memory controller 110, or memory 120. In another embodiment, integrating receivers may use the time periods defined between the edges of CKI and CKQ to determine an integration period used to capture the signal values on Q[1:N].

In FIG. 2, and the rest of this specification, CKI, CKQ, and other signals are shown as single ended signals. This is done merely for clarity of presentation. It should be understood that in all of the Figures, embodiments, and discussions, CKI, CKQ, or any other signals (e.g., $CK_1$ and Q[1:N]) may encompass both single-ended signals carried on a single line, and complementary or differential signals carried on two lines. In other words, for example, the line connecting CKI from memory controller 110 to memory 120 in FIG. 1 should be understood to represent one single-ended signal carried on a single signal line, or alternatively two complementary or differential signals, carried on two signal lines, but representing one value. Likewise, the CKI waveform illustrated in FIG. 2, for example, should be understood to convey the state of 1 single-ended signal, or alternatively the state of a complementary or differential signal (e.g., $CKI_P$ and $CKI_N$, or CKI and CKI*).

Figure 3:
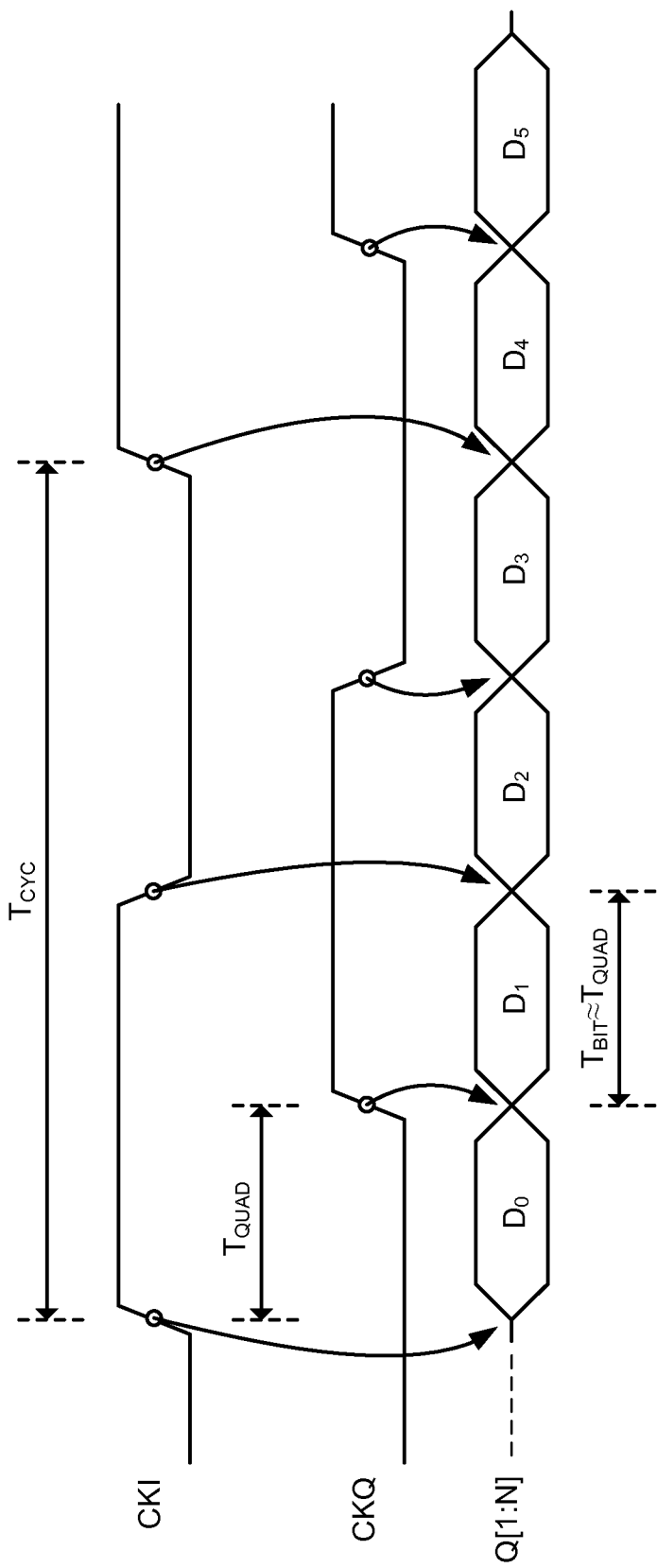
FIG. 3 is a timing diagram illustrating quadrature timing references used to drive signals.

FIG. 3 is a timing diagram illustrating quadrature timing references used to drive signals. The signals and timing illustrated in FIG. 3 may correspond to signals and timing of memory system 100. In particular, the signals and timing illustrated in FIG. 3 may correspond to the signals sent by either memory 120 or controller 110. In FIG. 3, as in FIG. 2, CKI is shown periodically cycling with a period of $T_{CYC}$. CKQ is likewise shown cycling with a period of $T_{CYC}$. CKQ is shown delayed from CKI by $T_{QUAD}$. $T_{QUAD}$ is shown as approximately ¼ of $T_{CYC}$. FIG. 3 is similar to FIG. 2, except the edges of CKI and CKQ are shown corresponding to roughly the transitions of the signals Q[1:N]. With the exception of the aforementioned relationship between the edges of the timing references CKI or CKQ and the transitions of the Q[1:N] signals, FIG. 3 is the same as FIG. 2. Thus, for the sake of brevity, a detailed description of the relationship between CKI and CKQ will not be repeated here.

Because the rising and falling edges of CKI and CKQ occur approximately $T_{QUAD}$ apart, the bit time ($T_{BIT}$) for a particular signal value (e.g., $D_0$, $D_1$, etc.) is also approximately $T_{QUAD}$. This is illustrated in FIG. 3 showing the time interval $T_{BIT} \approx T_{QUAD}$ between midpoints of the transitions on Q[1:N]. The edges of CKI and CKQ are shown to align with the midpoint of the transition (i.e., the start of the bit time) of each particular signal value. Thus, the term "quadrature" may also be used to indicate two or more clock signals with timing events of approximately $T_{BIT}$. It may also be used to indicate a relative alignment between a data interval and the transmit/receive timing event associated with the data interval. The alignment of the timing event is typically approximately zero (as shown in FIG. 3) or approximately $\frac{1}{2}T_{BIT}$ (as shown in FIG. 2).

Figure 4:
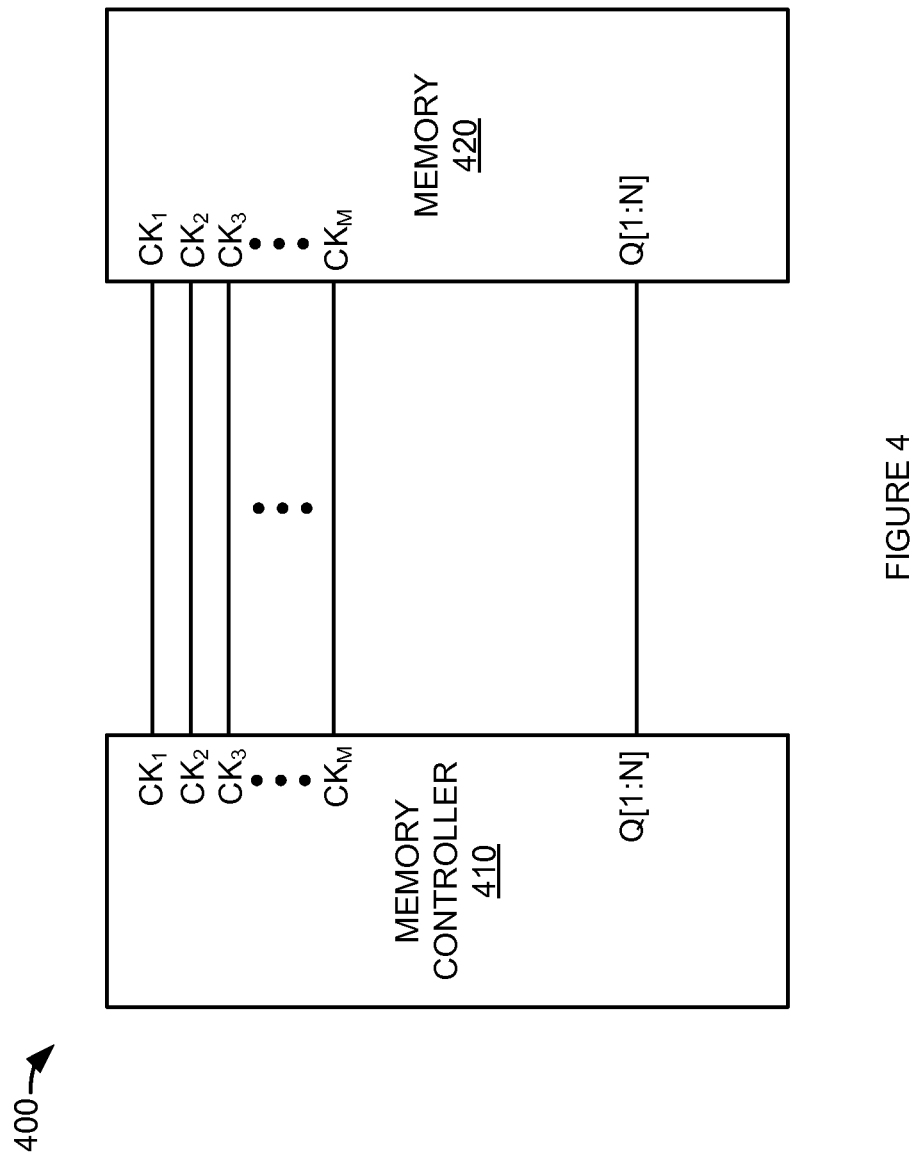
FIG. 4 is a block diagram illustrating a memory system.

FIG. 4 is a block diagram illustrating an embodiment of a memory system 400 comprising memory controller 410 and memory 420. Memory controller 410 includes M number of timing reference ports $CK_1$ through $CK_M$. As exemplified by memory controller 110, timing reference ports $CK_1$ through $CK_M$ may be driven by clock or strobe drivers included in memory controller 410 (not shown in FIG. 4). Memory controller 410 also includes N number of signal ports Q[1:N]. Signal ports Q[1:N] may be driven by signal drivers. Timing reference ports $CK_1$ through $CK_M$ of memory controller 410 are operatively coupled to memory 420 ports $CK_1$ through $CK_M$, respectively. Signal ports Q[1:N] are operatively coupled to memory 420 ports Q[1:N], respectively. As exemplified by memory 120, memory 420 may include clock, strobe, and or signal receivers (not shown in FIG. 4) to receive $CK_1$ through $CK_M$, and/or Q[1:N]. Memory 420 can include a DRAM core.

It should be understood that, similar to memory system 100, signal ports Q[1:N] of both memory controller 410 and memory 420 may correspond to any input or output pins of memory controller 410 or memory 420 that rely on timing reference signals communicated via timing reference ports $CK_1$ through $CK_M$ for synchronization. It should also be noted that memory system 100 can be a viewed as a subset of the generalized multiphase memory system 400 with M=2. Thus, the discussion relating to memory system 100, its components, and timing relating to FIG. 1-3 are applicable to memory system 400. As discussed previously, signal ports Q[1:N] can correspond to bidirectional data pins that communicate read and write data between memory controller 410 and memory 420. This includes the data pins (i.e., DQ pins), C/A bus pins, and/or other pins.

In an embodiment, the signals output by timing reference ports $CK_1$ through $CK_M$ have a phase relationship to each other determined by the number (i.e., M) of these signals. In other words, the M signals output by timing reference ports $CK_1$ through $CK_M$ define 2*M parts of a cycle. Each of these 2*M parts of a cycle is approximately equal to $T_{BIT}$ for the signals values being sent/received. The sent (and received) signal values on $CK_1$ through $CK_M$ per approximately 1/M of each cycle is illustrated in Table 2.

TABLE 2

| Part of cycle | $CK_1$ | $CK_2$ | $CK_3$ | ... | $CK_M$ |
|---|---|---|---|---|---|
| $1^{st}\ \frac{1}{(2*M)}$ of a cycle | 0 | 0 | 0 | ... | 0 |
| $2^{nd}\ \frac{1}{(2*M)}$ of a cycle | 1 | 0 | 0 | ... | 0 |
| $3^{rd}\ \frac{1}{(2*M)}$ of a cycle | 1 | 1 | 0 | ... | 0 |
| $4^{th}\ \frac{1}{(2*M)}$ of a cycle | 1 | 1 | 1 | ... | 0 |
| . | . | . | . | . | . |
| . | . | . | . | . | . |
| . | . | . | . | . | . |
| $M^{th}\ \frac{1}{(2*M)}$ of a cycle | 1 | 1 | 1 | ... | 0 |
| $(M+1)^{th}\ \frac{1}{(2*M)}$ of a cycle | 1 | 1 | 1 | ... | 1 |
| $(M+2)^{th}\ \frac{1}{(2*M)}$ of a cycle | 0 | 1 | 1 | ... | 1 |
| $(M+3)^{th}\ \frac{1}{(2*M)}$ of a cycle | 0 | 0 | 1 | ... | 1 |
| . | . | . | . | . | . |
| . | . | . | . | . | . |
| . | . | . | . | . | . |
| $(2*M)^{th}\ \frac{1}{(2*M)}$ of a cycle | 0 | 0 | 0 | ... | 1 |
| Start of new cycle (equivalent to $1^{st}\ \frac{1}{(2*M)}$ of a cycle, above) | 0 | 0 | 0 | ... | 0 |

Note that each of the fractional cycles given in Table 2 involves a unique combination of $CK_1$ through $CK_M$. Thus, the states of $CK_1$ through $CK_M$, or the transitions between these states, can be used as a timing reference to control the transmission or reception of other signals, such as Q[1:N], at a rate that is 2*M times the cycle time of any of the individual timing references $CK_1$ through $CK_M$.

It should be understood that Table 2 is merely exemplary and that other combinations that generate 2*M timing events with M clocking signals are possible. For example, $CK_1$ through $CK_M$ may each have a first signal state (e.g., high or "1") for ½* $M*T_{BIT}$ and a second signal state (e.g., low, or "0") of 1.5*$M*T_{BIT}$. Each of these clocks would then be offset from the next clock in the sequence (higher or lower) according to the following sequence (with Z=index of clock signal): $0*T_{BIT}$, $(½*Z-1)*T_{BIT}$, $Z*T_{BIT}$, $(Z+1)*T_{BIT}$, ... $(1.5*Z-1)*T_{BIT}$.

Figure 5:
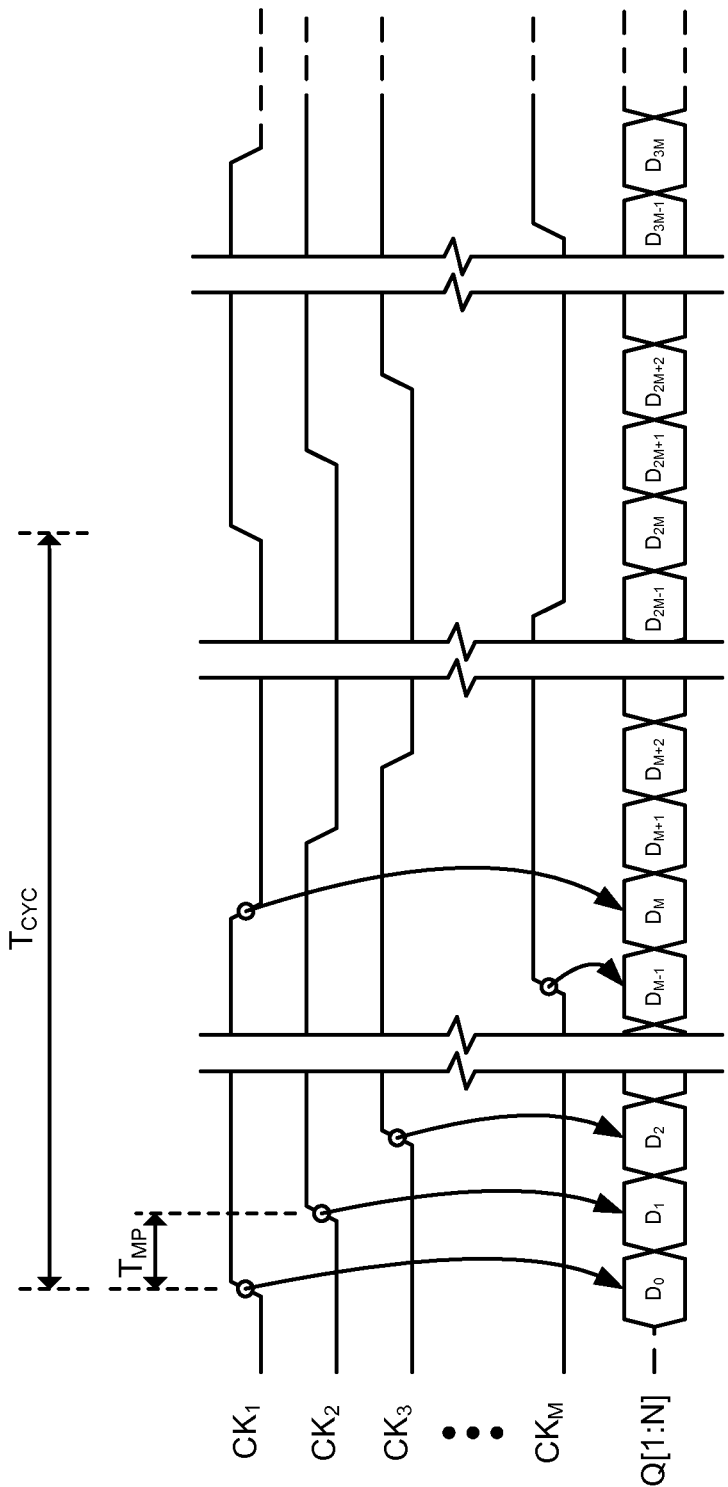
FIG. 5 is a timing diagram illustrating multiphase timing references used to receive signals.

FIG. 5 is a timing diagram illustrating a multiphase timing reference used to receive signals. The signals and timing illustrated in FIG. 5 may correspond to signals and timing of memory system 400. In particular, the signals and timing illustrated in FIG. 5 may correspond to the signals and timing received by memory 420. In FIG. 5, timing references $CK_1$ through $CK_M$ are shown periodically cycling with a period of $T_{CYC}$. Each timing reference $CK_1$ through $CK_M$ is shown delayed from the previous timing reference by $T_{MP}$. In other words, $CK_2$ is delayed from $CK_1$ by $T_{MP}$, $CK_3$ is delayed from $CK_2$ by $T_{MP}$, etc. Generalizing this, if k represents the timing reference number (i.e., $CK_k=CK_3$ for k=3) each $CK_{[1:M]}$ is delayed from $CK_1$ by $(k-1)*T_{MP}$. Thus, $CK_{M-1}$ would be delayed from $CK_1$ by $(M-2)*T_{MP}$. In FIG. 5, $CK_M$ is intended to be represented as delayed from $CK_1$ by $(M-1)*T_{MP}$. $T_{MP}$ is intended to be represented as approximately $1/(2*M)$ of $T_{CYC}$.

At the start of the timing diagram in FIG. 5, timing references $CK_1$ through $CK_M$ are all shown at a logic low. This corresponds to the first $$\frac{1}{(2*M)}$$

of a cycle given in Table 2. A first rising edge of $CK_1$ is shown at a time when the remainder of the timing references (i.e., $CK_2$ through $CK_M$, a.k.a $CK_{[2:M]}$) remain low. After $CK_1$ has risen, $CK_1$ is high and $CK_{[2:M]}$ are low. Thus, this corresponds to the second $$\frac{1}{(2*M)}$$

of a cycle shown in Table 2. The first rising edge of $CK_1$ in FIG. 2 is shown corresponding to the midpoint, or approximately the midpoint, of data $D_0$ on signals Q[1:N]. This may correspond, for example, to the arrival, as sent by memory controller 410, of the rising edge of $CK_1$ and a resolvable the data value $D_0$ at the receivers of memory 420.

At a time $T_{MP}$ after the first rising edge of $CK_1$, a first rising edge of $CK_2$ is shown. After $CK_2$ has risen $CK_{[1:2]}$ are high and $CK_{[3:M]}$ are low. Thus, this corresponds to the third $$\frac{1}{(2*M)}$$

of a cycle shown in Table 2. The first rising edge of $CK_2$ is shown corresponding to roughly a midpoint of data $D_1$ on signals Q[1:N]. This may correspond, for example, to the arrival, as sent by memory controller 410, of the rising edge of $CK_2$ and a resolvable the data value $D_1$ at the receivers of memory 420. This process continues for the rest of the timing references $CK_{[3:M]}$ with the rising edges of timing references $CK_{[3:M]}$ occurring $T_{MP}$ after the rising edge of the preceding timing reference, and no falling edges of any of $CK_{[1:M]}$. Thus, the first rising edge of $CK_M$ is represented as occurring $(M-1)*T_{MP}$ after the first rising edge of $CK_1$. The first rising edge of $CK_M$ is shown corresponding to roughly midpoint of data $D_{M-1}$ on signals Q[1:N]. After $CK_M$ has risen, all of $CK_2$ through $CK_M$ are high. This corresponds to the $$(M+1)^{th} \frac{1}{(2*M)}$$

of a cycle shown in Table 2.

At a time approximately $T_{MP}$ after the first rising edge of $CK_M$, a falling edge of $CK_1$ is shown. This falling edge corresponds to approximately $½T_{CYC}$ after the first rising edge of $CK_1$. After $CK_1$ has fallen. $CK_1$ is low and $CK_{[2:M]}$ are high. Thus, this corresponds to the $$(M+2)^{th} \frac{1}{(2*M)}$$

of a cycle shown in Table 2. The falling edge of $CK_1$ is shown corresponding to roughly a midpoint of data $D_M$ on signals Q[1:N]. At a time approximately $T_{MP}$ after the falling edge of $CK_1$, a falling edge of $CK_2$ is shown. The falling edge of $CK_2$ is shown corresponding to roughly a midpoint of data $D_{M+1}$ on signals Q[1:N]. This process continues for the rest of the timing references $CK_{[3:M]}$ with the falling edges of timing references $CK_{[3:M]}$ occurring $T_{MP}$ after the falling edge of the preceding timing reference, and no rising edges of any of $CK_{[1:M]}$. Thus, the first falling edge of $CK_M$ is represented as occurring $(2M-1)*T_{MP}$ after the first rising edge of $CK_1$. After the falling edge of $CK_M$, it should be noted that all of $CK_{[1:M]}$ are low. Thus, this corresponds to the first $$\frac{1}{(2*M)}$$

of a cycle shown in Table 2.

As can be seen in FIG. 5, the rising and falling edges of $CK_{[1:M]}$ each occur approximately $T_{MP}$ apart from a rising or falling edge of the any other timing reference signal. Because the edges (both rising and falling) are unique in time from the edges of any other timing reference signal $CK_{[1:M]}$, the transitions of $CK_1$ though $CK_M$ may be used as timing references to capture (or resolve) the signals being received on Q[1:N] at a rate that is 2*M times $T_{CYC}$. The signals can be received on Q[1:N] at a rate that is 2M times $T_{CYC}$ even though the individual timing reference signals $CK_1$ though $CK_M$ are only cycling at a frequency of $1/T_{CYC}$.

In an embodiment, sampling receivers may use the edges of $CK_{[1:M]}$ to resolve the logic values on Q[1:N] into either memory controller 410 or memory 420. In another embodiment, integrating receivers may use the time periods defined between successive edges of $CK_{[1:N]}$ to determine an integration period used to resolve the logic values on Q[1:N].

Figure 6:
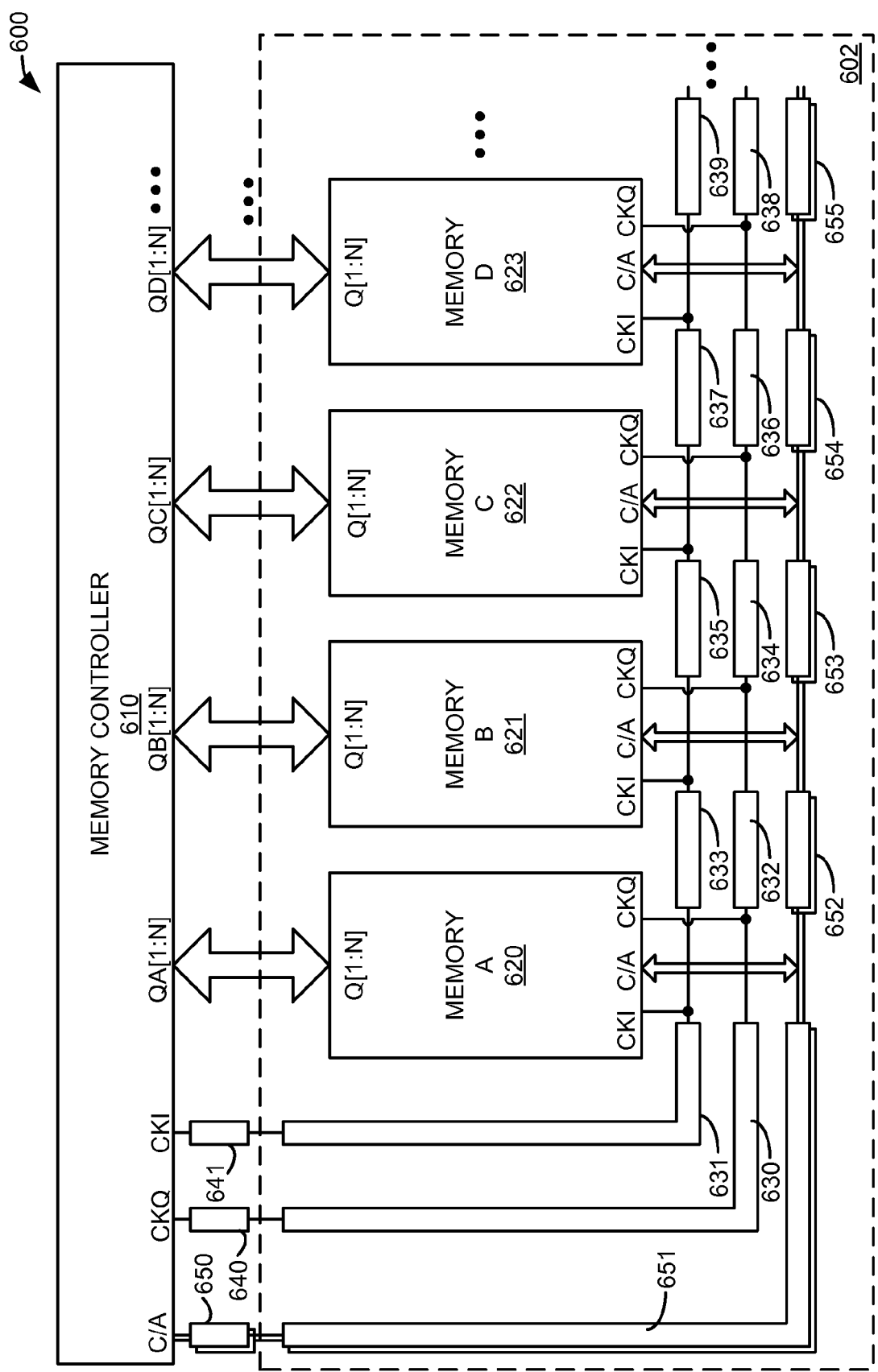
FIG. 6 is a block diagram illustrating quadrature timing references used in a fly-by topology.

FIG. 6 is a block diagram illustrating a quadrature timing reference used in a fly-by topology according to an embodiment. In FIG. 6, memory system 600 is shown comprising memory controller 610, memory devices: memory A 620, memory B 621, memory C 622, and memory D 623. Additional memories, not shown in FIG. 6, may also be included in memory system 600. All of these memories (620-623) may comprise part of a memory module 602. As exemplified in FIG. 1, and the discussions of FIG. 1-5, memory controller 610 and memories 620-623 may include clock/strobe/signal drivers and receivers.

The Q[1:N] ports of memory A 620 are operatively coupled to the QA[1:N] ports of memory controller 610. The Q[1:N] ports of memory B 621 are operatively coupled to the QB[1:N] ports of memory controller 610. The Q[1:N] ports of memory C 620 are operatively coupled to the QC[1:N] ports of memory controller 610. Additional memories (not shown in FIG. 6) may be coupled via their Q[1:N] ports to additional ports (not shown in FIG. 6) of memory controller 610. Timing reference signals output from the CKI and CKQ ports of memory controller 610 may be driven with a quadrature phase relationship to each other. As discussed previously, these timing reference signals may synchronize the transfer of address, control, or data to/from memories 620-623 at rates that are greater than the cycle time ($T_{CYC}$) of timing reference signals CKI and CKQ.

The CKQ port of memory controller 610 is operatively coupled to memory A 620 by way of transmission line 640 and transmission line 641. The first end of transmission line 640 is shown connected to the CKQ port of memory controller 610. The second end of transmission line 640 is shown connected to a first end of transmission line 630 at the boundary of memory module 602. The second end of transmission line 630 is connected to the CKQ port of memory A 620. The CKI port of memory controller 610 is operatively coupled to memory A 620 by way of transmission line 641 and transmission line 631. The first end of transmission line 641 is shown connected to the CKI port of memory controller 610. The second end of transmission line 641 is shown connected to a first end of transmission line 631 at the boundary of memory module 602. The second end of transmission line 631 is connected to the CKI port of memory A 620.

The first end of transmission line 632 is connected to the second end of transmission line 630. The second end of transmission line 632 is connected to the CKQ port of memory B 621. Thus, it should be noted, the CKQ signal output at the CKQ port of memory controller 610 propagates over transmission line 640 and then transmission line 630 to reach the CKQ port of memory A. However, to reach memory B, the CKQ signal output at the CKQ port of memory controller 610 must propagate over transmission lines 640, 630, and 632 to reach the CKQ port of memory B 621. Accordingly, the CKQ signal output at the CKQ port of memory controller 610 reaches memory B 621 after it reaches memory A 620. The additional time required for the CKQ signal to reach memory B 621 is determined by, and because of, the propagation delay attributable to transmission line 632. Likewise, additional time is required for the CKI signal to reach memory B 621 as compared to the time required for the CKI signal to reach memory A 620. This additional time is determined by, and because of, the propagation delay attributable to transmission line 633.

The first end of transmission line 634 is connected to the second end of transmission line 632. The second end of transmission line 634 is connected to the CKQ port of memory C 622. The first end of transmission line 635 is connected to the second end of transmission line 633. The second end of transmission line 635 is connected to the CKI port of memory C 622. The first end of transmission line 636 is connected to the second end of transmission line 634. The second end of transmission line 634 is connected to the CKQ port of memory D 623. The first end of transmission line 637 is connected to the second end of transmission line 635. The second end of transmission line 637 is connected to the CKI port of memory D 622. The first end of transmission line 638 is connected to the second end of transmission line 636. The first end of transmission line 639 is connected to the second end of transmission line 637. Transmission lines 638 and 639 may carry the CKQ and CKI signals to additional memories and transmission lines not shown in FIG. 6.

As can be seen in FIG. 6, the CKI and CKQ signals emanating from the CKI and CKQ, respectively, ports of memory controller 610 traverse a different set of transmission lines in order to reach each different memory. In other words, to reach memory A 620, the CKI signal propagates across transmission lines 641 and 631; to reach memory B, the CKI signal propagates across transmission lines 641, 631, and 633; to reach memory C, the CKI signal propagates across transmission lines 641, 631, 633, and 635; etc. Thus, the propagation delay (or "flight-time") from the CKI or CKQ port to each of the memories 620-623 is different for each of the memories 620-623 because a different combination of transmission lines (each with an associated propagation delay) must be traversed to reach a particular memory 620-623. Note also that because the CKI or CKQ signal reaches memory A first, then memory B, then memory C, etc. the CM or CKQ signal "flies-by" memory A to reach memory B; then flies-by memory B to reach memory C; etc. Thus, the serial-like routing of CKI and CKQ shown in FIG. 6 is called a "fly-by" topology.

In addition, in an embodiment, memory controller 610 includes command/address (C/A) bus ports. The C/A bus ports of memory controller 610 is operatively coupled to memory A 620 by way of transmission lines 650 and transmission lines 651. The first ends of the plurality of transmission lines 650 is shown connected to the C/A ports of memory controller 610. The second ends of transmission lines 650 is shown connected to the first ends of the plurality of transmission lines 651 at the boundary of memory module 602. The first ends of the plurality of transmission lines 652 is connected to the second ends of transmission lines 651. The second ends of the plurality of transmission lines 652 is connected to the C/A ports of memory B 621. The first ends of the plurality of transmission lines 653 is connected to the second ends of transmission lines 652. The second ends of the plurality of transmission lines 653 is connected to the C/A ports of memory C 622. The first ends of the plurality of transmission lines 654 is connected to the second ends of transmission lines 653. The second ends of the plurality of transmission lines 654 is connected to the C/A ports of memory D 623. The first end of the plurality of transmission lines 655 is connected to the second ends of transmission lines 654. Transmission lines 655 may carry the C/A bus signals to additional memories and transmission lines not shown in FIG. 6.

Note that like CKI and CKQ, the signals of the C/A bus are also routed in a fly-by topology. If appropriate propagation delays are chosen for transmission lines 630-655, the CKI and/or CKQ signals can be designed to arrive at each memory 620-623 with a fixed timing relationship to the signals of the C/A bus. For example, the propagation delays of transmission lines 650-655 may be designed to match the propagation delays of transmission lines 630-641. In this case, the timing relationship between the timing reference CKI and CKQ signals and the C/A bus signals, as they are output from memory controller 610 is maintained at the point where they arrive at each individual memory 620-623. In another example, the propagation delays of transmission lines 650-655 may be designed to match the propagation delays of transmission lines 630-641 plus or minus a fixed offset.

In an embodiment, additional external timing references (not shown in FIG. 6) may be provided. These additional external timing references may also be routed in a fly-by topology similar to the C/A and CKQ/CKI signals shown in FIG. 6. These additional external timing references may determine the timing of signals sent or received via the Q[1:N] ports of memories 620-623. These additional external timing references may be paired and have a quadrature relationship to the members of the pair. These additional external timing references may cycle at a different frequency than CKI and CKQ. In particular, if these additional external timing references are determining the timing of signals sent or received via the Q[1:N] ports of memories 620-623 may cycle at a multiple (e.g., 2 or ½) of the cycle frequency of CKI and CKQ. Cycling these additional external timing references at a multiple greater than one (e.g., 2) allows, for example, the C/A bus signals to operate at a lower data rate than the Q[1:N] data buses.

In another embodiment, additional internal timing references may be generated internally to memories 620-623 from CKI and/or CKQ, or the additional external timing references discussed previously. These internally generated timing references may be controlled to have a phase offset relative to CKI, CKQ, and/or other external timing references.

Figure 7:
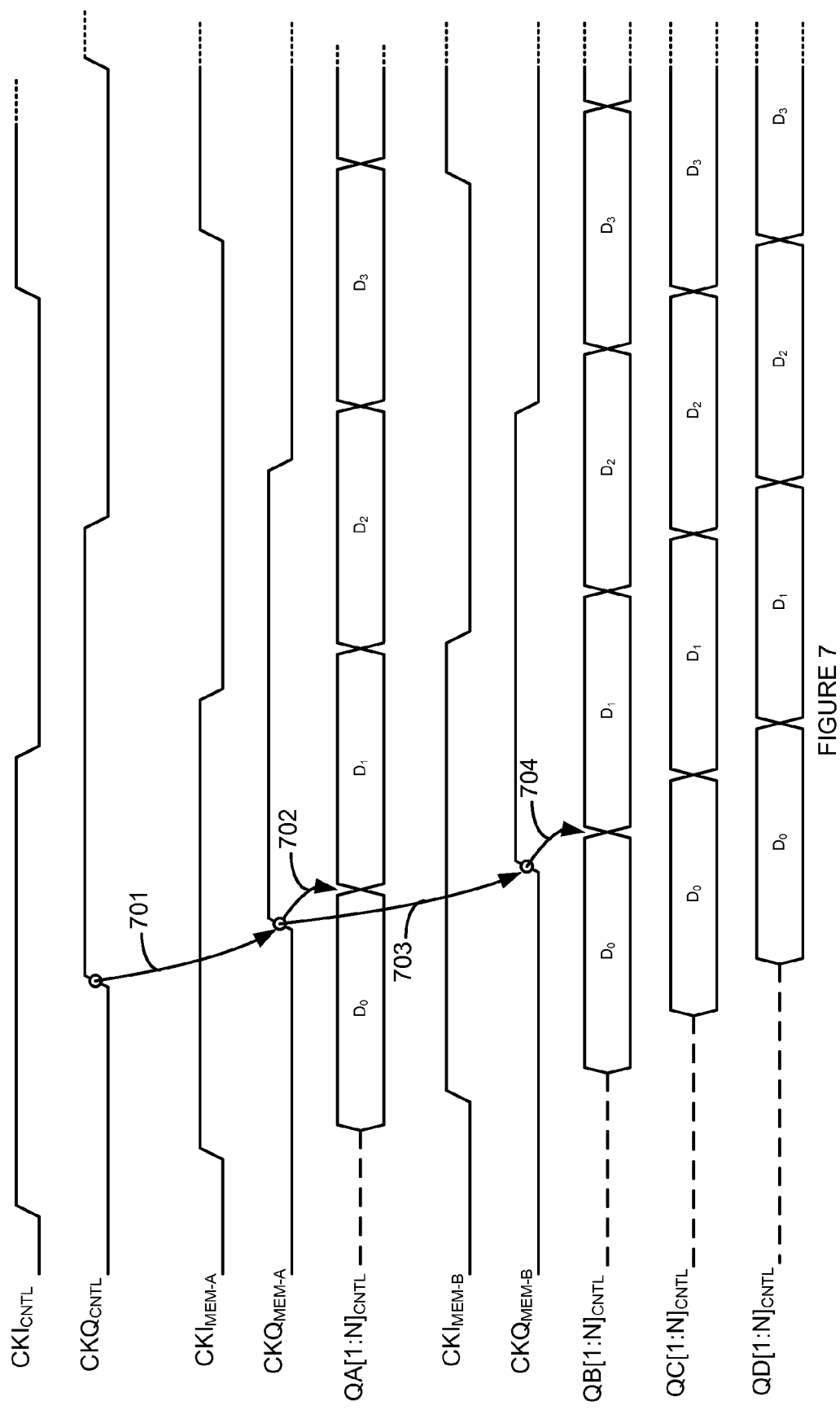
FIG. 7 is a timing diagram illustrating signals driven by devices in a quadrature timed fly-by topology.

FIG. 7 is a timing diagram illustrating signals driven by devices in a quadrature timed fly-by topology. The signals and timing illustrated in FIG. 7 may correspond to signals and timing of memory system 600. In particular, the signals and timing illustrated in FIG. 7 may correspond to the signals and timing of timing reference signals CKI and CKQ as they are received by memories 620-623 and the signals and timing of the Q[1:N] signals driven by memories 620-623 and received by memory controller 610.

In FIG. 7, the timing reference signals at memory controller 610 are shown as $CKI_{CNTL}$ and $CKQ_{CNTL}$. As previously discussed, timing reference signals $CKI_{CNTL}$ and $CKQ_{CNTL}$ are driven by memory controller 610 in quadrature phase relationship to each other. Timing reference signals $CKI_{CNTL}$ and $CKQ_{CNTL}$ propagate (with associated propagation delay attributable to transmission lines 630-632, 640, and 641) from memory controller 610 to memory A 620. In FIG. 7, the timing of these timing reference signals at memory A is shown as $CKI_{MEM-A}$ and $CKQ_{MEM-A}$. As an example, arrow 701 indicates the propagation delay associated with the timing reference CKQ at memory controller 610 (i.e., $CKQ_{CNTL}$) and the timing reference CKQ as it arrives at memory A (i.e., $CKQ_{MEM-A}$). Arrow 701 indicates the propagation delay associated with the rising edge of CKQ as it leaves memory (as $CKQ_{CNTL}$) controller 610 and arrives at memory A 620 (as $CKQ_{MEM-A}$) delayed by the propagation delays of transmission lines 640 and 630.

In FIG. 7, the rising edge of CKQ causes the Q[1:N] ports of memory A 620 to change from outputting $D_0$ to outputting $D_1$. More specifically, the CKQ signal is electrically coupled to circuitry within memory A 620, and in response to the rising edge of the CKQ signal, the output driver circuitry associated with the Q[1:N] port stops transmitting the data signal associated with $D_0$ and begins transmitting the data signal associated with $D_1$. After the rising edge of timing reference signal CKQ arrives at memory A 620 (as $CKQ_{MEM-A}$), the signal values at the output ports Q[1:N] of memory A 620 change from outputting $D_0$ to outputting $D_1$ after an internal propagation delay. The changed signal values at the output ports of Q[1:N] of memory A 620 are reflected at the input ports QA[1:N] of memory controller 610 after another delay attributable to the transmission lines carrying the Q[1:N] signals to the QA[1:N] ports of memory controller 610. These delays and causality are shown in FIG. 7 by arrow 702.

After arriving at memory A 620, the rising edge of CKQ propagates along transmission line 632 to arrive at memory B 621. Arrow 703 indicates the propagation delay associated with the rising edge of CKQ as it leaves memory A 620 (as $CKQ_{MEM-A}$) and arrives at memory B 621 (as $CKQ_{MEM-B}$) delayed by the propagation delay of transmission line 632.

The rising edge of CKQ causes the Q[1:N] ports of memory B 621 to change from outputting $D_0$ to outputting $D_1$. After the rising edge of timing reference signal CKQ arrives at memory B 621 (as $CKQ_{MEM-B}$), the signal values at the output ports of Q[1:N] of memory B 621 change from outputting $D_0$ to outputting $D_1$ after an internal propagation delay. The changed signal values at the output ports of Q[1:N] of memory B 621 are reflected at the input ports QB[1:N] of memory controller 610 after another delay attributable to the transmission lines carrying the Q[1:N] signals to the QA[1:N] ports of memory controller 610. These delays and causality are shown in FIG. 7 by arrow 704. As shown in FIG. 7, because timing reference signal CKQ is arriving at each memory 621-623 slightly later than it arrived at the preceding memory 620-623, the Q[1:N] outputs of each successive memory 621-623 change slightly later than the outputs Q[1:N] of the previous memory changed. Accordingly, if the transmission lines coupling the Q[1:N] ports of each memory 620-623 to memory controller 610 have the same (or approximately the same) propagation delay, because of the fly-by topology of timing references CKI and CKQ, the new data (e.g., $D_1$) arrives at memory controller 610 at a different time for each memory 620-623. This is illustrated in FIG. 7 by the delays in time of the changes from $D_0$ to $D_1$ etc. arriving later for each successive memory 620-623.

Figure 8:
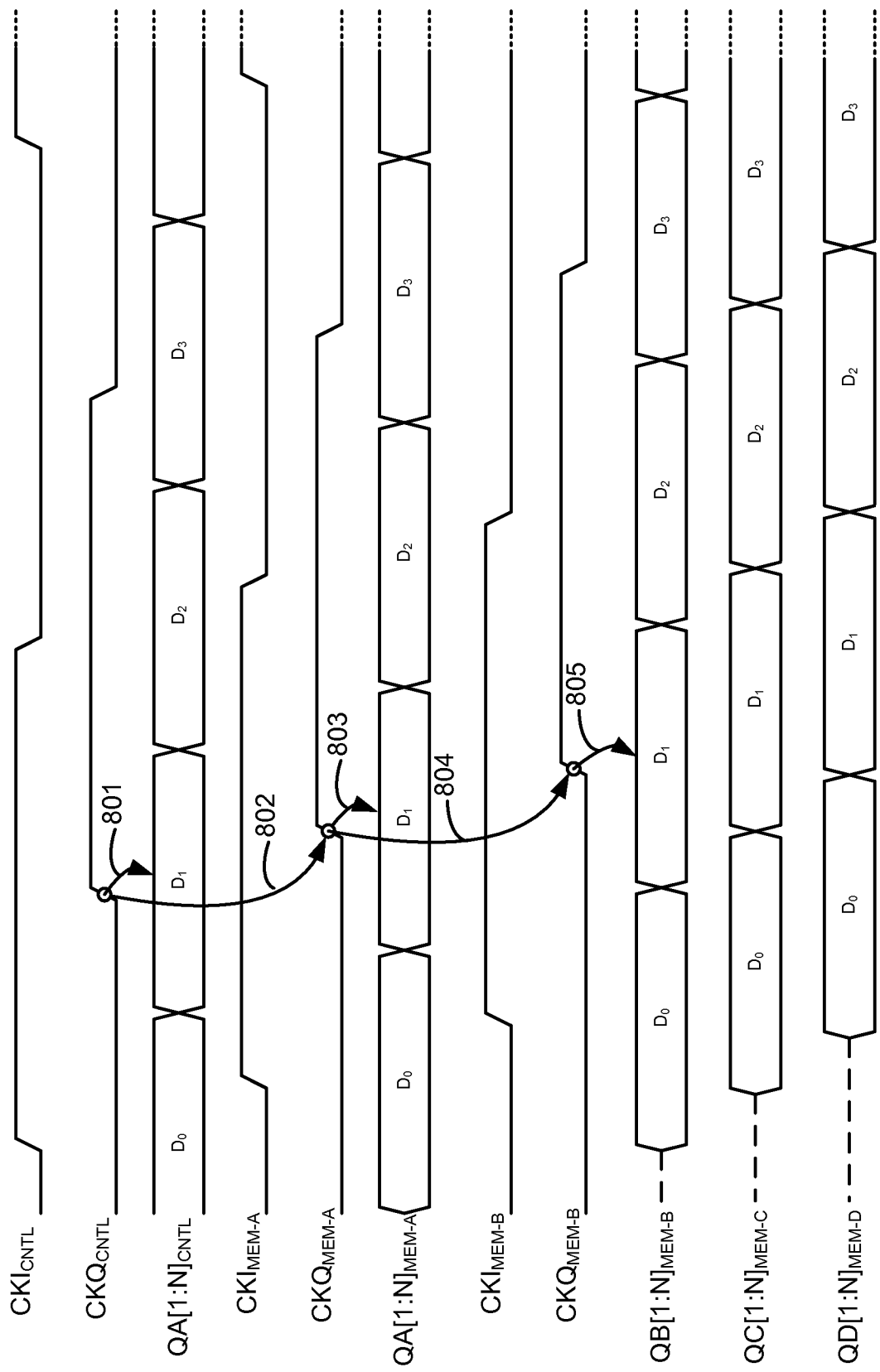
FIG. 8 is a timing diagram illustrating signals received by devices in a quadrature timed fly-by topology.

FIG. 8 is a timing diagram illustrating signals received by devices in a quadrature timed fly-by topology. The signals and timing illustrated in FIG. 8 may correspond to signals and timing of memory system 600. In particular, the signals and timing illustrated in FIG. 8 may correspond to the signals and timing of timing reference signals CKI and CKQ as they are driven by memory controller 620 and the signals and timing received by memories 620-623 at their Q[1:N] ports.

In FIG. 8, the timing reference signals at memory controller 610 are shown as $CKI_{CNTL}$ and $CKQ_{CNTL}$. As previously discussed, timing reference signals $CKI_{CNTL}$ and $CKQ_{CNTL}$ are driven by memory controller 610 in quadrature phase relationship to each other. Timing reference signals $CKI_{CNTL}$ and $CKQ_{CNTL}$ propagate (with associated propagation delay attributable to transmission lines 630-633, 640 and 641) from memory controller 610 to memory A 620. Also driven from memory controller 610, with an appropriate relationship to $CKQ_{CNTL}$ (and thus $CKI_{CNTL}$) are the signal values (QA[1:N]$_{CNTL}$) intended for memory A 610. The relationship shown in FIG. 8 approximates the midpoint of outputting $D_1$ on QA[1:N]. This relationship is shown in FIG. 8 by arrow 801.

In FIG. 8, the timing reference signals CKI and CKQ at memory A 620 are shown as $CKI_{MEM-A}$ and $CKQ_{MEM-A}$. Arrow 802 indicates the propagation delay associated with the rising edge of CKQ as it leaves memory (as $CKQ_{CNTL}$) controller 610 and arrives at memory A 620 (as $CKQ_{MEM-A}$) delayed by the propagation delays of transmission lines 640 and 630. The signal values driven from memory controller 610 (i.e., QA[1:N]$_{CNTL}$) arrive at memory A 620 after a propagation delay attributable to the transmission lines carrying the signals from the QA[1:N] ports of memory controller 610 to the Q[1:N] ports of memory A 620. In an embodiment, the propagation delay attributable to the transmission lines carrying the signals from the QA[1:N] ports of memory controller 610 to the Q[1:N] ports of memory A 620 is approximately equal to the delay associated with propagation delay attributable to transmission lines 630-633. In an embodiment, this would be the case with the C/A bus signals propagating across transmission lines 650-655. In another embodiment, the propagation delay attributable to the transmission lines carrying the signals from the QA[1:N] ports of memory controller 610 to the Q[1:N] ports of memory A 620 is significantly different than the delay associated with propagation delay attributable to transmission lines 630-633. In this case, the relationship of $CKQ_{CNTL}$ (and thus $CKI_{CNTL}$) to the signal values (QA[1:N]$_{CNTL}$) intended for memory A 610 may be adjusted to an appropriate relationship to accomplish reliable reception of the signals from the QA[1:N] ports of memory controller 610 at the Q[1:N] ports of memory A 620. In FIG. 8, this relationship is shown by arrow 803 which relates the rising edge of CKQ at memory A (i.e., $CKQ_{MEM-A}$) to approximately the midpoint of $D_1$ arriving at memory a 620 (i.e., QA[1:N]$_{MEM-A}$).

After arriving at memory A 620, the rising edge of CKQ propagates along transmission line 632 to arrive at memory B 621. Arrow 804 indicates the propagation delay associated with the rising edge of CKQ as it leaves memory A 620 (as $CKQ_{MEM-A}$) and arrives at memory B 621 (as $CKQ_{MEM-B}$) delayed by the propagation delay of transmission line 632. The signal values driven from memory controller 610 intended for memory B 621 (i.e., QB[1:N]$_{CNTL}$) arrive at memory B 621 after a propagation delay attributable to the transmission lines carrying the signals from the QA[1:N] ports of memory controller 610 to the Q[1:N] ports of memory B 621. In an embodiment, the propagation delay attributable to the transmission lines carrying the signals from the QB[1:N] ports of memory controller 610 to the Q[1:N] ports of memory B 621 is approximately equal to the delay associated with propagation delay attributable to transmission lines 630-633. In an embodiment, this would be the case with the C/A bus signals propagating across transmission lines 650-655. In another embodiment, the propagation delay attributable to the transmission lines carrying the signals from the QB[1:N] ports of memory controller 610 to the Q[1:N] ports of memory B 621 is significantly different than the delay associated with propagation delay attributable to transmission lines 630-633. In this case, the relationship of $CKQ_{CNTL}$ (and thus $CKI_{CNTL}$) to the signal values (QB[1:N]$_{CNTL}$) intended for memory A 610 may be adjusted to an appropriate relationship with timing references $CKQ_{CNTL}$, (and thus $CKI_{CNTL}$) to accomplish reliable reception of the signals from the QB[1:N] ports of memory controller 610 at the Q[1:N] ports of memory B 621. In FIG. 8, this relationship is shown by arrow 805 which relates the rising edge of CKQ at memory A (i.e., $CKQ_{MEM-B}$) to approximately the midpoint of $D_1$ arriving at memory B 621 (i.e., QB[1:N]$_{MEM-A}$).

As shown in FIG. 8, because the timing reference signal CKQ (and thus CKI) is arriving at each memory 621-623 slightly later than it arrived at the preceding memory 620-623, the Q[1:N] inputs of each successive memory 621-623 should receive their respective signals slightly later than the input signals at the Q[1:N] of the previous memory. Accordingly, if the transmission lines coupling the Q[1:N] ports of each memory 620-623 to memory controller 610 have the same (or approximately the same) propagation delay, because of the fly-by topology of timing references CKI and CKQ, the new data (e.g., $D_1$) should be controlled to arrive at each memory 620-621 at a different time for each memory 620-623. This is illustrated in FIG. 8 by the delays in the time of the changes from $D_0$ to $D_1$ etc. arriving at memory 620-623 later for each successive memory 620-623. In other words, the transmission of data Q[1:N] to each memory 620-623 is staggered for each successive memory 620-623 along the routing of CKI and CKQ (and/or C/A bus signals) in order to account for the staggered arrival times to each memory 620-623 of CKI and CKQ (and/or C/A bus). Similarly, the read sample times at memory controller 610 ports QA[1:N], QB[1:N], etc. are staggered for each successive memory 620-623 in order to account for the staggered arrival times of data sent from memories 620-623 in response to the staggered arrival times of CKI and CKQ (and/or C/A bus signals).

Figure 9:
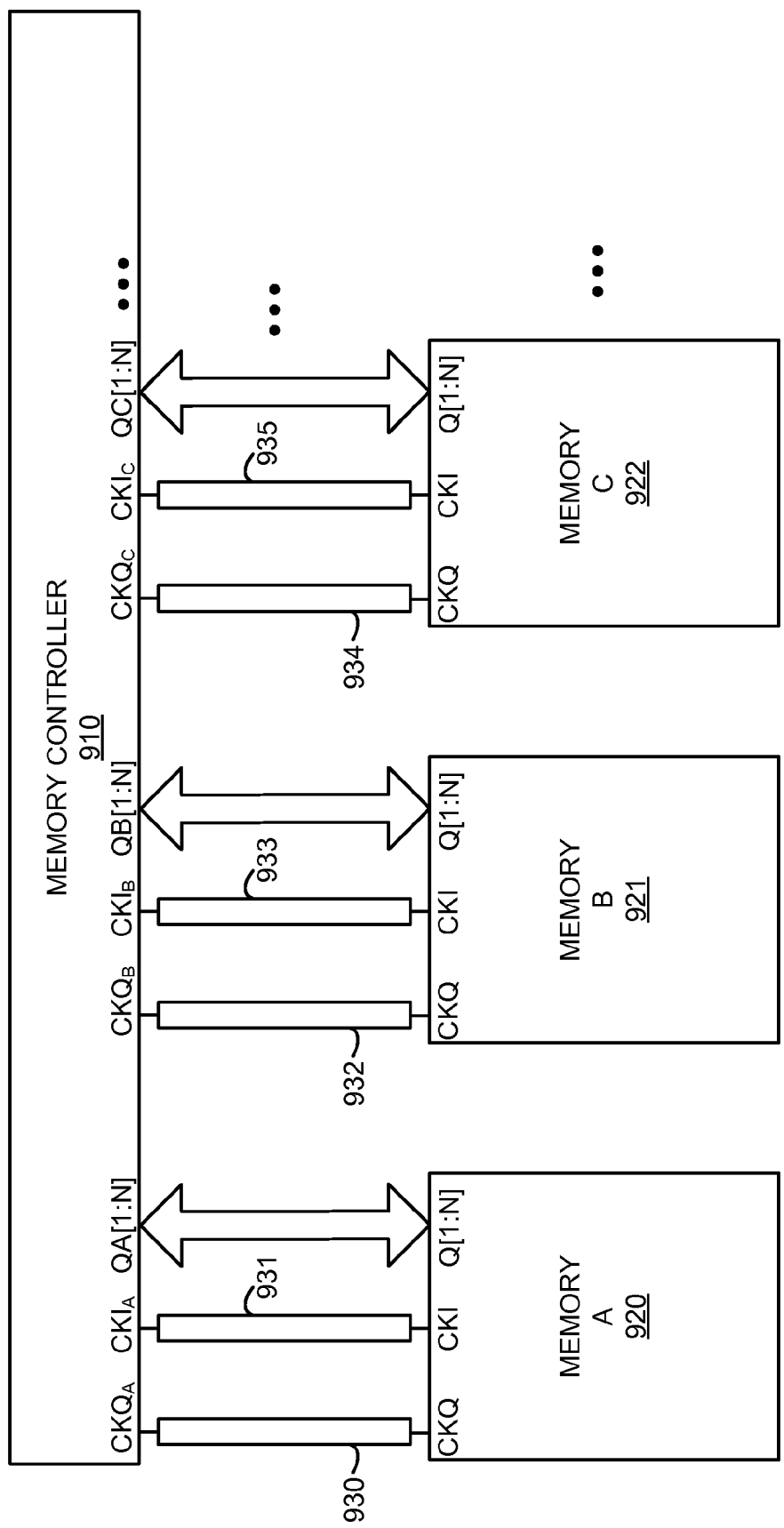
FIG. 9 is a block diagram illustrating quadrature timing references in a point-to-point topology.

FIG. 9 is a block diagram illustrating quadrature timing references in a point-to-point topology. In FIG. 9, memory system 900 comprises memory controller 910, memory A 920, memory B 921, and memory C 922. Memory system 900 may also include additional memories not shown in FIG. 9. Memory controller 910 is shown with timing reference ports $CKI_A$, $CKQ_A$, $CKI_B$, $CKQ_B$, $CKI_C$, and $CKQ_C$. Memory controller 910 may also include additional timing reference ports not shown in FIG. 9. Memory controller 910 is also shown with signal ports QA[1:N], QB[1:N], and QC[1:N]. Memory controller 910 may also include additional signal ports not shown in FIG. 9. Each memory 920-922 is shown with timing reference ports CKI, CKQ and signal ports Q[1:N]. Although FIG. 9 shows quadrature timing reference (e.g., CKI and CKQ), it should be understood that this is an exemplary embodiment and that the principles shown in FIG. 9 are applicable to multiphase (e.g., $CK_1$ to $CK_M$) timing references such as those shown and discussed in relation to FIGS. 4-5. As exemplified in FIG. 1, and the discussion of FIG. 1, memory controller 910 and memories 920-922 may include clock/strobe/signal drivers and receivers.

Timing reference ports $CKI_A$ and $CKQ_A$ of memory controller 910 are connected to timing reference ports CKI and CKQ, respectively, of memory A 920 by transmission lines 931 and 930, respectively. Signal ports QA[1:N] of memory controller 910 are connected to signal ports Q[1:N] of memory A 920. Timing reference ports $CKI_B$ and $CKQ_B$ of memory controller 910 are connected to timing reference ports CKI and CKQ, respectively, of memory B 921 by transmission lines 933 and 932, respectively. Signal ports QB[1:N] of memory controller 910 are connected to signal ports Q[1:N] of memory B 921. Timing reference ports $CKI_C$ and $CKQ_C$ of memory controller 910 are connected to timing reference ports CKI and CKQ, respectively, of memory C 922 by transmission lines 935 and 934, respectively. Signal ports QC[1:N] of memory controller 910 are connected to signal ports Q[1:N] of memory C 922.

The pairs of $CKI_A$ and $CKQ_A$, $CKI_B$ and $CKQ_B$, $CKI_C$ and $CKQ_C$ may be controlled to output timing reference signals (e.g., clocks or strobes) that have a quadrature phase relationship to the other signal of the pair. One or more of these clocks or strobes may also be stopped from time to time. Stopping the switching of a clock or strobe may help reduce power consumption by one or more of memory controller 910 and/or memories 920-922. In an embodiment, memory controller 910 drives timing reference signals (e.g., $CKI_A$ and $CKQ_A$) both when it is sending signals (e.g., via QA[1:N]) to a memory 920-922, and receiving signals from the memory. In another embodiment, memory controller 910 drives timing reference signals when it is sending signals, but receives timing reference signals from the memory when the memory is sending signals.

As can be seen in FIG. 9, each individual memory 920-922 is coupled to an individual quadrature timing reference pair CKI, CKQ. These quadrature timing reference pairs are routed to each individual memory by a separate set of transmission lines for each individual memory 920-922. In other words, the timing reference ports of memory A 920 are coupled to memory controller 910 by transmission lines 930 and 931, memory B 921 is coupled by transmission lines 932 and 933, etc. Accordingly, there are only two connection points on the transmission lines coupling the quadrature timing references between memories 920-922 and memory controller 910. Because there are only two connection points (one at each end of a transmission line), this arrangement may be referred to as a point to point topology.

It should be understood that the topology and functioning of memory controller 910 and an individual memory shown in FIG. 9 (for example, memory A 920) can be considered the equivalent of memory systems 100 or 400. These systems were discussed previously with reference to FIGS. 1-5 and those discussions are applicable to memory controller 910 as coupled to the individual memories 920-922 shown in FIG. 9. Accordingly, for the sake of brevity, those discussions will not be repeated here.

Figure 10:
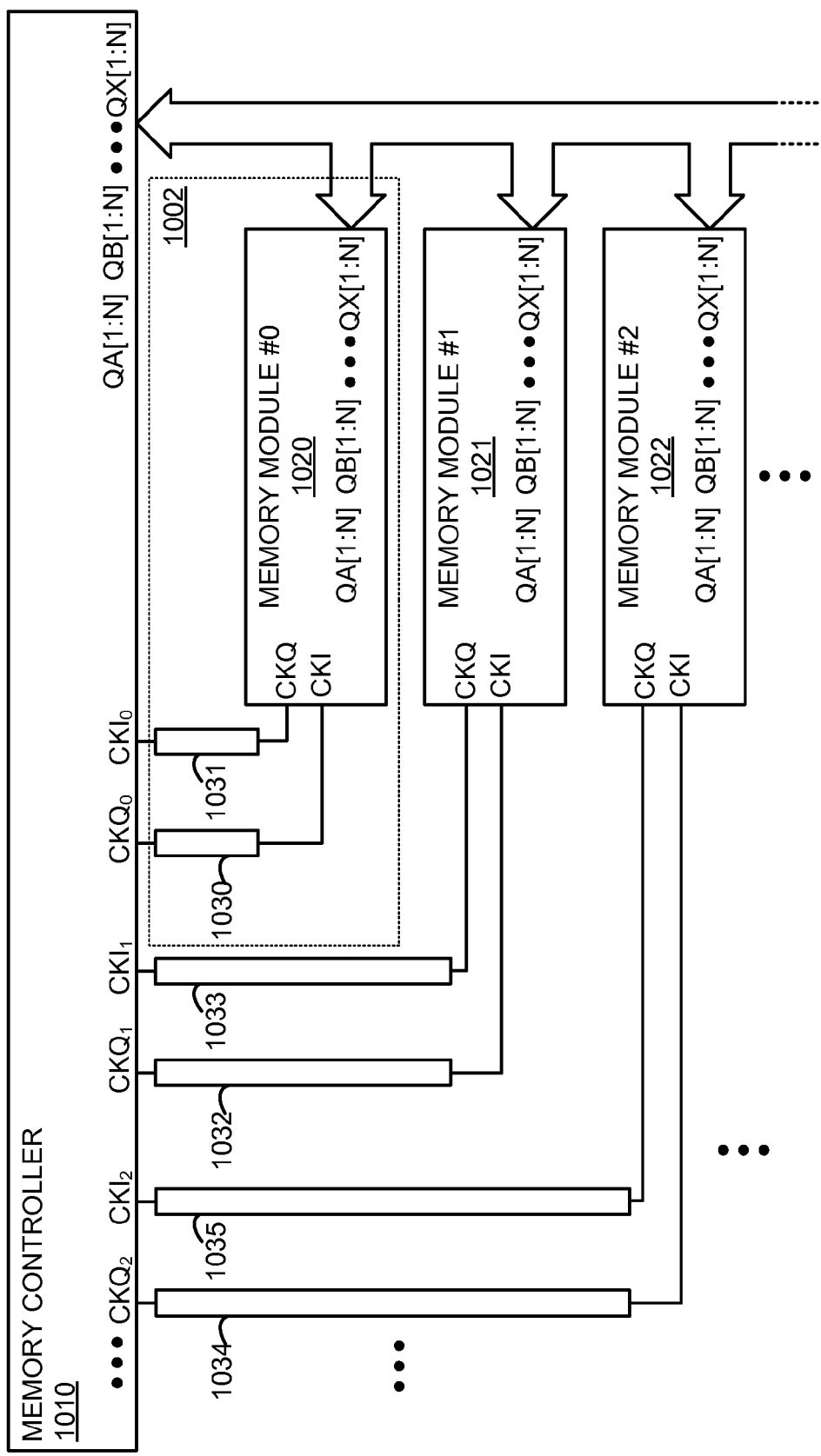
FIG. 10 is a block diagram illustrating a system with quadrature timing references in a point-to-point topology to memory modules.

FIG. 10 is a block diagram illustrating a system with quadrature timing references in a point-to-point topology to memory modules. In FIG. 10, memory system 1000 comprises memory controller 1010, memory module #0 1020, memory module #1 1021, and memory module #3 1022. Memory system 1000 may also include additional memory modules not shown in FIG. 10. Memory controller 1010 is shown with timing reference ports $CKI_0$, $CKQ_0$, $CKI_1$, $CKQ_1$, $CKI_2$, and $CKQ_2$. Memory controller 1010 may also include additional timing reference ports not shown in FIG. 10. Memory controller 1010 is also shown with an arbitrary number of signal ports grouped into signal groups of N signals, QA[1:N] through QX[1:N]. Memory controller 1010 may also include additional signal ports not shown in FIG. 10. Each memory module 1020-1022 is shown with timing reference ports CKI, CKQ and signal ports QA[1:N]-QX[1:N]. Although FIG. 10 shows quadrature timing references (e.g., $CKI_X$ and $CKQ_X$), it should be understood that this is an exemplary embodiment and that the principles shown in FIG. 10 are applicable to multiphase (e.g., $CK_1$ to $CK_M$) timing references such as those shown and discussed in relation to FIGS. 4-5. As exemplified in FIG. 1, and the discussion of FIG. 1, memory controller 1010 and the memories of memory modules 1020-1022 may include clock/strobe/signal drivers and receivers.

Timing reference ports $CKI_0$ and $CKQ_0$ of memory controller 1010 are connected to timing reference ports CKI and CKQ, respectively, of memory module #0 1020 by transmission lines 1031 and 1030, respectively. Signal ports QA[1:N]-QX[1:N] of memory controller 1010 are connected to signal ports QA[1:N]-QX[1:N] of memory module #0 1020. Timing reference ports $CKI_1$ and $CKQ_1$ of memory controller 1010 are connected to timing reference ports CKI and CKQ, respectively, of memory module #1 1021 by transmission lines 1033 and 1032, respectively. Signal ports QA[1:N]-QX[1:N] of memory controller 1010 are connected to signal ports QA[1:N]-QX[1:N] of memory module #1 1021. Timing reference ports $CKI_2$ and $CKQ_2$ of memory controller 1010 are connected to timing reference ports CKI and CKQ, respectively, of memory module #2 1022 by transmission lines 1035 and 1034, respectively. Signal ports QA[1:N]-QX[1:N] of memory controller 1010 are connected to signal ports QA[1:N]-QX[1:N] of memory module #2 1022.

The pairs of $CKI_0$ and $CKQ_0$, $CKI_1$ and $CKQ_1$, $CKI_2$ and $CKQ_2$ may be controlled to output timing reference signals that have a quadrature phase relationship to the other signal of the pair. One or more of these clocks or strobes may also be stopped from time to time. Stopping the switching of a clock or strobe may help reduce power consumption by one or more of memory controller 1010 and/or memory modules 1020-1022. In an embodiment, memory controller 1010 drives timing reference signals (e.g., $CKI_0$ and $CKQ_0$) both when it is sending signals (e.g., via QA[1:N]-QX[1:N]) to a memory module 1020-1022, and receiving signals from a memory module 1020-1022 (e.g., via QA[1:N]-QX[1:N]). In another embodiment, memory controller 1010 drives timing reference signals when it is sending signals via QA[1:N]-QX[1:N], but receives timing reference signals from the memory module 1020-1022 when the memory module 1020-1022 is sending signals via QA[1:N]-QX[1:N].

As can be seen in FIG. 10, each individual memory module 1020-1022 is coupled to an individual quadrature timing reference pair CKI, CKQ. These quadrature timing reference pairs are routed to each individual memory by a separate set of transmission lines for each individual memory module 1020-1022 in a point to point topology. Inside each memory module 1020-1022, the quadrature timing reference pair CKI, CKQ may be buffered or routed in almost any topology including fly-by, point-to-point, "star" and "T" topologies, or a combination thereof.

To illustrate, consider the elements inside box 1002 in FIG. 10 in relation to FIG. 6. The elements inside box 1002 comprise memory module #0 and transmission lines 1030-1031. Memory module #0 1020 may correspond and have internal signal routing as shown in memory module 602 of FIG. 6. Likewise, transmission lines 1030 and 1031 may correspond to transmission lines 640 and 641, respectively. Finally, signal ports via QA[1:N]-QX[1:N] may correspond to the signals from memories 620-623 in FIG. 6 that couple to signal ports QA[1:N], QB[1:N], etc. of memory controller 610. This correspondence may be applied in reverse. That is, memory module 602 may be seen in FIG. 6 as being one of memory modules 1020-1022 in FIG. 10.

From the foregoing, it should be understood that the topology and functioning of memory controller 1010 and an individual memory module 1020-1023 shown in FIG. 10 (for example, memory module #0 1020) can be considered the equivalent of memory systems 600. These systems were discussed previously with reference to FIGS. 6-7 and those discussions are applicable to memory controller 1010 as coupled to the individual memory modules 1020-1022 shown in FIG. 10. Accordingly, for the sake of brevity, those discussions will not be repeated here.

Figure 11:
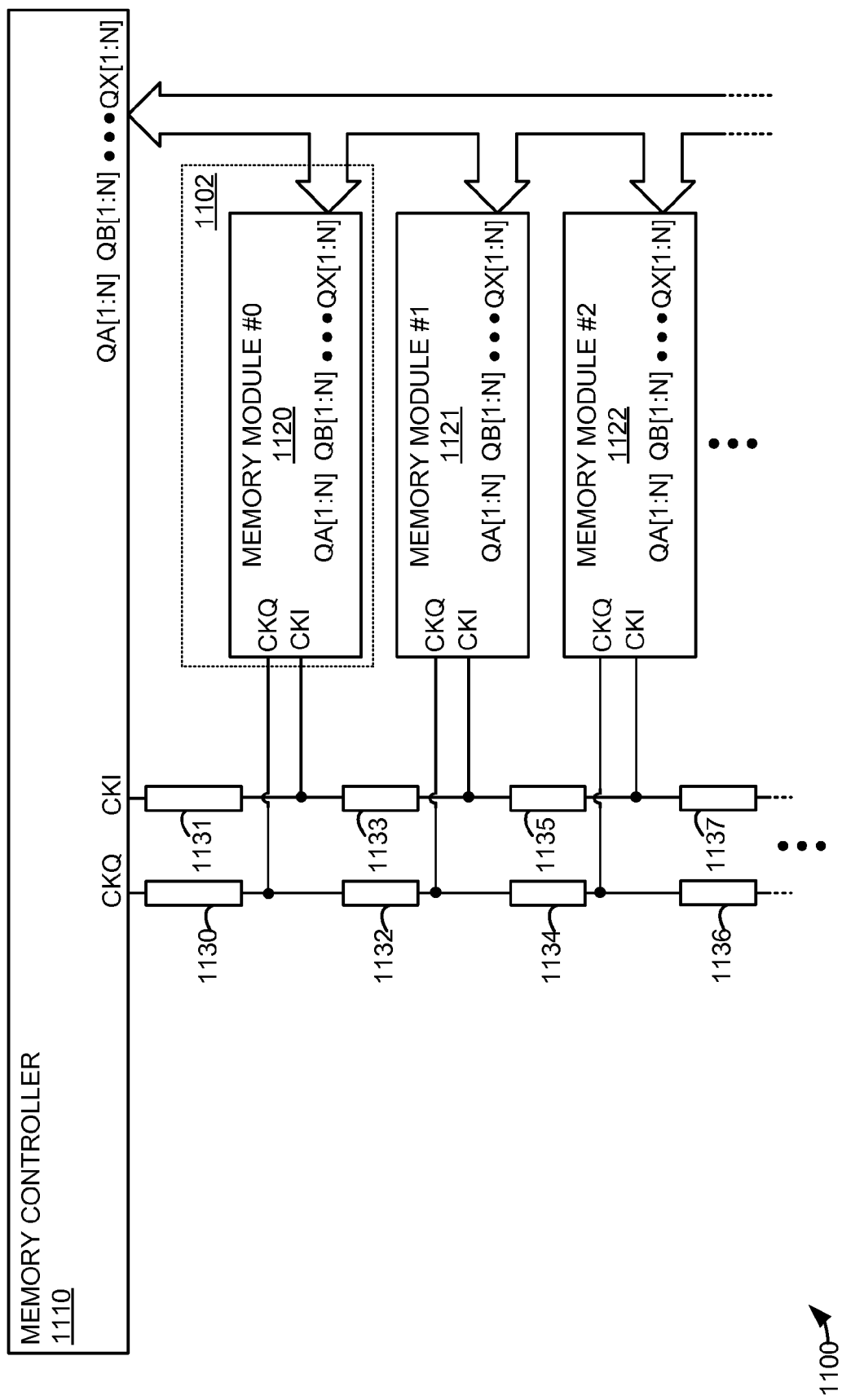
FIG. 11 is a block diagram illustrating a system with quadrature timing references in a fly-by topology to memory modules.

FIG. 11 is a block diagram illustrating a system with quadrature timing references in a fly-by topology to memory modules. In FIG. 11, memory system 1100 comprises memory controller 1110, memory module #0 1120, memory module #1 1121, and memory module #3 1122. Memory system 1100 may also include additional memory modules not shown in FIG. 11. Memory controller 1110 is shown with timing reference ports CKI and CKQ. Memory controller 1110 is also shown with an arbitrary number of signal ports grouped into signal groups of N signals, QA[1:N] through QX[1:N]. Memory controller 1110 may also include additional signal ports not shown in FIG. 11. Each memory module 1120-1122 is shown with timing reference ports CKI, CKQ and signal ports QA[1:N]-QX[1:N]. As exemplified in FIG. 1, and the discussion of FIG. 1, memory controller 1110 and the memories of memory modules 1120-1122 may include clock/strobe/signal drivers and receivers.

Timing reference signals output from the CKI and CKQ ports of memory controller 1110 may be driven with a quadrature phase relationship to each other. These timing reference signals may synchronize the transfer of address, control, or data to/from memory modules 1120-1122 at rates that are greater than the cycle time ($T_{CYC}$) of timing reference signals CKI and CKQ.

The CKQ port of memory controller 1110 is operatively coupled to memory module #0 1120 by way of transmission line 1130. The first end of transmission line 1130 is shown connected to the CKQ port of memory controller 1110. The second end of transmission line 1130 is connected to the CKQ port of memory module #0 1120. The CKI port of memory controller 1110 is operatively coupled to memory module #0 1120 by way of transmission line 1131. The first end of transmission line 1131 is shown connected to the CKI port of memory controller 1110. The second end of transmission line 1131 is connected to the CKI port of memory module #0 1120.

The first end of transmission line 1132 is connected to the second end of transmission line 1130. The second end of transmission line 1132 is connected to the CKQ port of memory module #1 1121. Thus, it should be noted, the CKQ signal output at the CKQ port of memory controller 1110 propagates over transmission line 1130 to reach the CKQ port of memory module #0 1120. However, to reach memory module #1, the CKQ signal output at the CKQ port of memory controller 1110 must propagate over transmission lines 1130 and 1132 to reach the CKQ port of memory module #1 1121. Accordingly, the CKQ signal output at the CKQ port of memory controller 1110 reaches memory module 1121 after it reaches memory module 1120. The additional time required for the CKQ signal to reach memory module 1121 is determined by, and because of, the propagation delay attributable to transmission line 1132. Likewise, additional time is required for the CKI signal to reach memory module #1 1121 as compared to the time required for the CKI signal to reach memory module #0 1120. This additional time is determined by, and because of, the propagation delay attributable to transmission line 1133.

In FIG. 11, the first end of transmission line 1134 is shown connected to the second end of transmission line 1132. The second end of transmission line 1134 is connected to the CKQ port of memory module #2 1122. The first end of transmission line 1135 is connected to the second end of transmission line 1133. The second end of transmission line 1135 is connected to the CKI port of memory module #2 1122. The first end of transmission line 1136 is connected to the second end of transmission line 1134. The first end of transmission line 1137 is connected to the second end of transmission line 1135. Transmission lines 1136 and 1137 may carry the CKQ and CKI signals to additional memory modules and transmission lines not shown in FIG. 11.

Signal ports QA[1:N]-QX[1:N] of memory controller 1110 are connected to signal ports QA[1:N]-QX[1:N] of memory modules 1120-1122. In an embodiment, memory controller 1110 drives timing reference signals CKI and CKQ both when it is sending signals (e.g., via QA[1:N]-QX[1:N]) to a memory module 1120-1122, and receiving signals from a memory module 1120-1122 (e.g., via QA[1:N]-QX[1:N]). In another embodiment, memory controller 1110 drives timing reference signals when it is sending signals via QA[1:N]-QX[1:N], but receives timing reference signals from a memory module 1120-1122 when the memory module 1120-1122 is sending signals via QA[1:N]-QX[1:N].

Inside (or disposed on) each memory module 1120-1122, the quadrature timing reference signal pair CKI, CKQ may be routed in almost any topology including fly-by, point-to-point, "star", and "T" topologies, or a combination thereof. To illustrate, consider the elements inside box 1102 in FIG. 11 in relation to FIG. 6. Memory module #0 1120 may correspond and have internal and external signal routing as shown in memory module 602 of FIG. 6.

Figure 12:
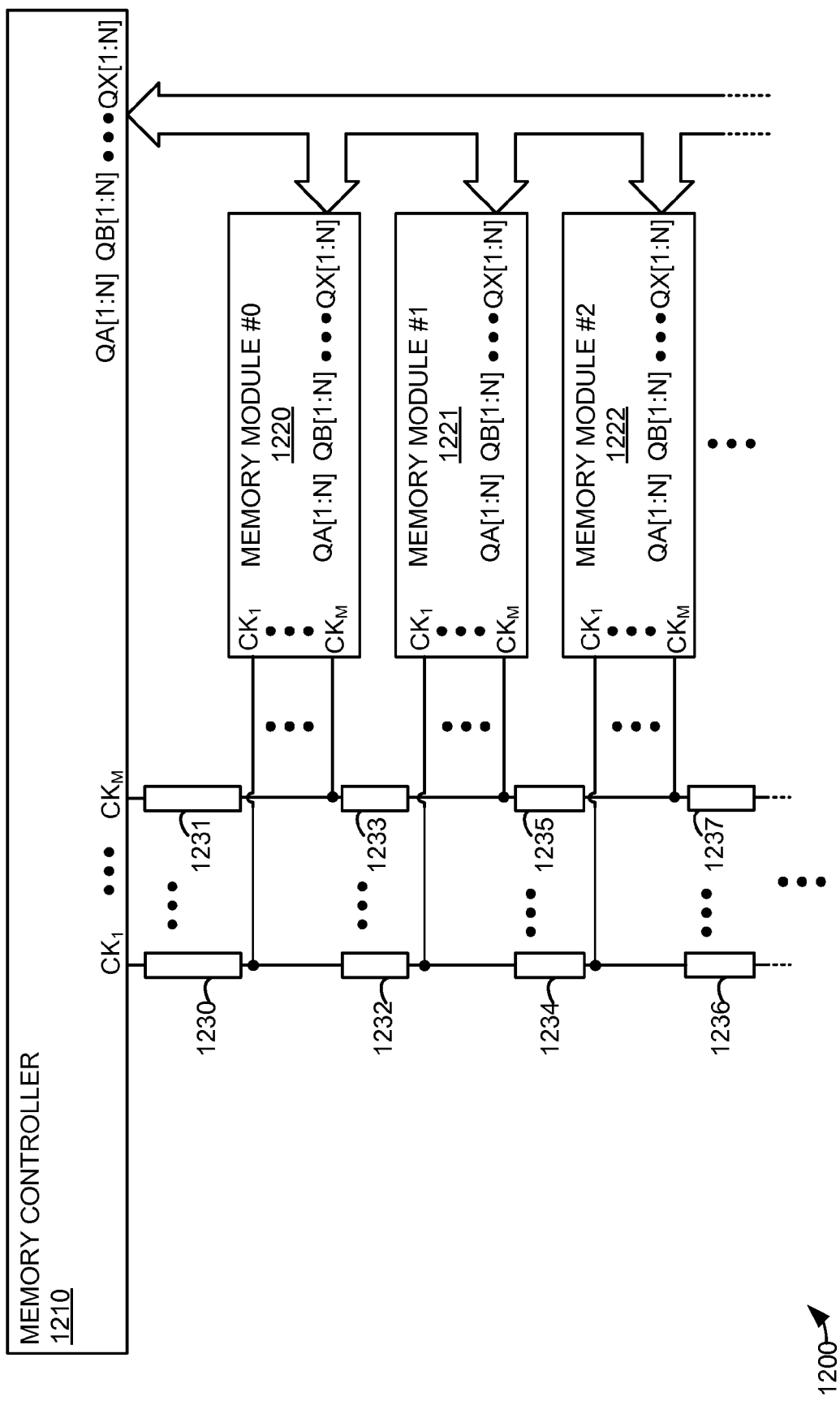
FIG. 12 is a block diagram illustrating a system with multiphase timing references in a fly-by topology to memory modules.

FIG. 12 is a block diagram illustrating an embodiment of a system with multiphase timing references (in a fly-by topology) to memory modules. In FIG. 12, memory system 1200 comprises memory controller 1210, memory module #0 1220, memory module #1 1221, and memory module #2 1222. Memory system 1200 may also include additional memory modules not shown in FIG. 12. Memory controller 1210 is shown with timing reference ports $CK_1$ through $CK_M$ ($CK_{[1:M]}$). Memory controller 1210 is also shown with an arbitrary number of signal ports grouped into signal groups of N signals, QA[1:N] through QX[1:N]. Memory controller 1210 may also include additional signal ports not shown in FIG. 12. Each memory module 1220-1222 is shown with timing reference ports $CK_{[1:M]}$ and signal ports QA[1:N]-QX[1:N]. As exemplified in FIG. 1, and the discussion of FIG. 1, memory controller 1210 and the memories of memory modules 1220-1222 may include clock/strobe/signal drivers and receivers.

Timing reference signals output from the $CK_{[1:M]}$ ports of memory controller 1210 may be driven with a multiphase relationship to each other such as was described with reference to FIGS. 4-5. These timing reference signals may synchronize the transfer of address, control, or data to/from memory modules 1220-1222 at rates that are greater than the cycle time ($T_{CYC}$) of the individual timing reference signals $CK_{[1:M]}$.

The $CK_0$ port of memory controller 1210 is shown operatively coupled to memory module #0 1220 by way of transmission line 1230. The first end of transmission line 1230 is shown connected to the $CK_0$ port of memory controller 1210. The second end of transmission line 1230 is connected to the $CK_0$ port of memory module #0 1220. The $CK_M$ port of memory controller 1210 is operatively coupled to memory module #0 1220 by way of transmission line 1231. The first end of transmission line 1231 is shown connected to the $CK_M$ port of memory controller 1210. The second end of transmission line 1231 is shown connected to the $CK_M$ port of memory module #0 1220.

The first end of transmission line 1232 is connected to the second end of transmission line 1230. The second end of transmission line 1232 is connected to the $CK_0$ port of memory module #1 1221. Thus, it should be noted, the $CK_0$ signal output at the $CK_0$ port of memory controller 1210 propagates over transmission line 1230 to reach the $CK_0$ port of memory module #0 1220. However, to reach memory module #1, the $CK_0$ signal output at the $CK_0$ port of memory controller 1210 must propagate over transmission lines 1230 and 1232 to reach the $CK_0$ port of memory module #1 1221. Accordingly, the $CK_0$ signal output at the $CK_0$ port of memory controller 1210 reaches memory module 1221 after it reaches memory module 1220. The additional time required for the $CK_0$ signal to reach memory module 1221 is determined by, and because of, the propagation delay attributable to transmission line 1232. Likewise, additional time is required for the other multiphase signals (i.e., $CK_{[2:M]}$) to reach memory module #1 1221 as compared to the time required for these signals to reach memory module #0 1220.

In FIG. 12, the first end of transmission line 1234 is shown connected to the second end of transmission line 1232. The second end of transmission line 1134 is connected to the $CK_0$ port of memory module #2 1222. The first end of transmission line 1235 is connected to the second end of transmission line 1233. The second end of transmission line 1235 is connected to the $CK_M$ port of memory module #2 1222. The first end of transmission line 1236 is connected to the second end of transmission line 1234. The first end of transmission line 1237 is connected to the second end of transmission line 1235. Transmission lines 1236 and 1237 represent transmission lines that may carry the $CK_{[2:M]}$ signals to additional memory modules and transmission lines not shown in FIG. 12.

Figure 13:
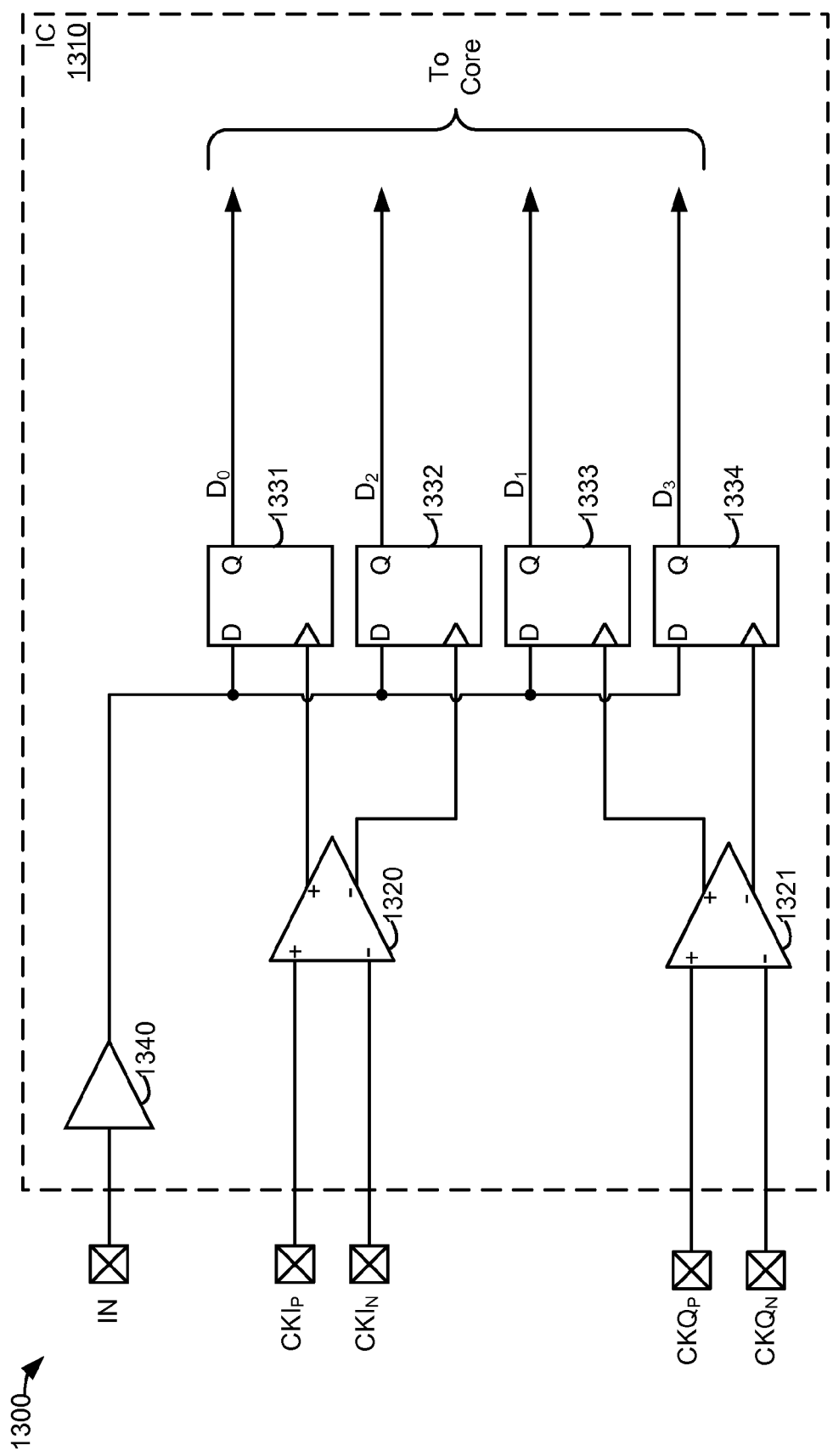
FIG. 13 is a block diagram illustrating a quadrature timed sampling receiver.

FIG. 13 is a block diagram illustrating a quadrature timed sampling receiver. In FIG. 13, sampling receiver 1300 comprises differential signal receiver 1320, differential signal receiver 1321, latches 1331-1334, and input buffer 1340. Differential receivers 1320-1321, latches 1331-1334, and buffer 1340 are shown inside integrated circuit (IC) 1310. IC 1310 may correspond to any of the memories or memory controllers discussed previously. Differential signal receivers 1320 and 1321 may correspond to receivers 121 and 122, respectively shown in FIG. 1. Latches 1331-1334 and buffer 1340 may correspond to receivers 123 in FIG. 1.

In FIG. 13, the quadrature timing references CKI and CKQ are shown as differential or complementary signals made of up $CKI_P$ and $CKI_N$, and $CKQ_P$ and $CKQ_N$, respectively. Differential receiver 1320 receives the positive polarity signal $CKI_P$ from outside IC 1310 on its non-inverting input. Differential receiver 1320 receives the negative polarity signal $CKI_N$ from outside IC 1310 on its inverting input. Differential receiver 1321 receives the positive polarity signal $CKQ_P$ from outside IC 1310 on its non-inverting input. Differential receiver 1321 receives the negative polarity signal $CKQ_P$ from outside IC 1310 on its inverting input.

The non-inverting output of differential receiver 1320 is operatively coupled to the clock input of latch 1331. The inverting output of differential receiver 1320 is operatively coupled to the clock input of latch 1332. The non-inverting output of differential receiver 1321 is operatively coupled to the clock input of latch 1333. The inverting output of differential receiver 1321 is operatively coupled to the clock input of latch 1334. It should be understood that the signals on the outputs of differential receivers 1320 and 1321 in FIG. 13 are derived from $CKI_P$, $CKI_N$, $CKQ_P$, and $CKQ_N$ and may include additional buffering, delays, or other modifications to the input signals $CKI_P$, $CKI_N$, $CKQ_P$, or $CKQ_N$. In an embodiment, buffer 1340 receives a single-ended input signal, IN, from outside IC 1310. Buffer 1340 may also receive a voltage reference signal (e.g., VREF, not shown) that is either externally provided or internally generated. In other embodiments, buffer 1340 may receive a differential or complementary input signal. The output of buffer 1340 is operatively coupled to the data (or "D") input of latches 1331-1334. The output of latch 1331 is data bit $D_0$. The output of latch 1332 is data bit $D_1$. The output of latch 1333 is data bit $D_2$. The output of latch 1334 is data bit $D_3$. Data bits $D_0$-$D_3$ are shown as being sent to the core of IC 1310. The core of IC 1310 may be, for example a DRAM core, or one or more microprocessor cores.

In operation, as discussed previously, CKI and CKQ have a quadrature phase relationship to with respect to each other. The rising edge of CKI results in a rising edge of the non-inverting output of differential receiver 1320. This rising edge causes latch 1331 to capture the input signal IN as relayed by buffer 1340 on its data input. This captured value is output by latch 1331 as data bit $D_0$. Approximately ¼ of a cycle later, a rising edge occurs on CKQ. This rising edge of CKQ results in a rising edge of the non-inverting output of differential receiver 1321. This rising edge causes latch 1333 to capture the input signal IN as relayed by buffer 1340 on its data input. This captured value is output by latch 1333 as data bit $D_1$. Approximately ¼ of a cycle later, a falling edge occurs on CKI. This falling edge of CKI results in a rising edge of the inverting output of differential receiver 1320. This rising edge causes latch 1332 to capture the input signal IN as relayed by buffer 1340 on its data input. This captured value is output by latch 1332 as data bit $D_2$. Approximately ¼ of a cycle later, a falling edge occurs on CKQ. This falling edge of CKQ results in a rising edge of the inverting output of differential receiver 1321. This rising edge causes latch 1334 to capture the input signal IN as relayed by buffer 1340 on its data input. This captured value is output by latch 1334 as data bit $D_3$.

Figure 14:
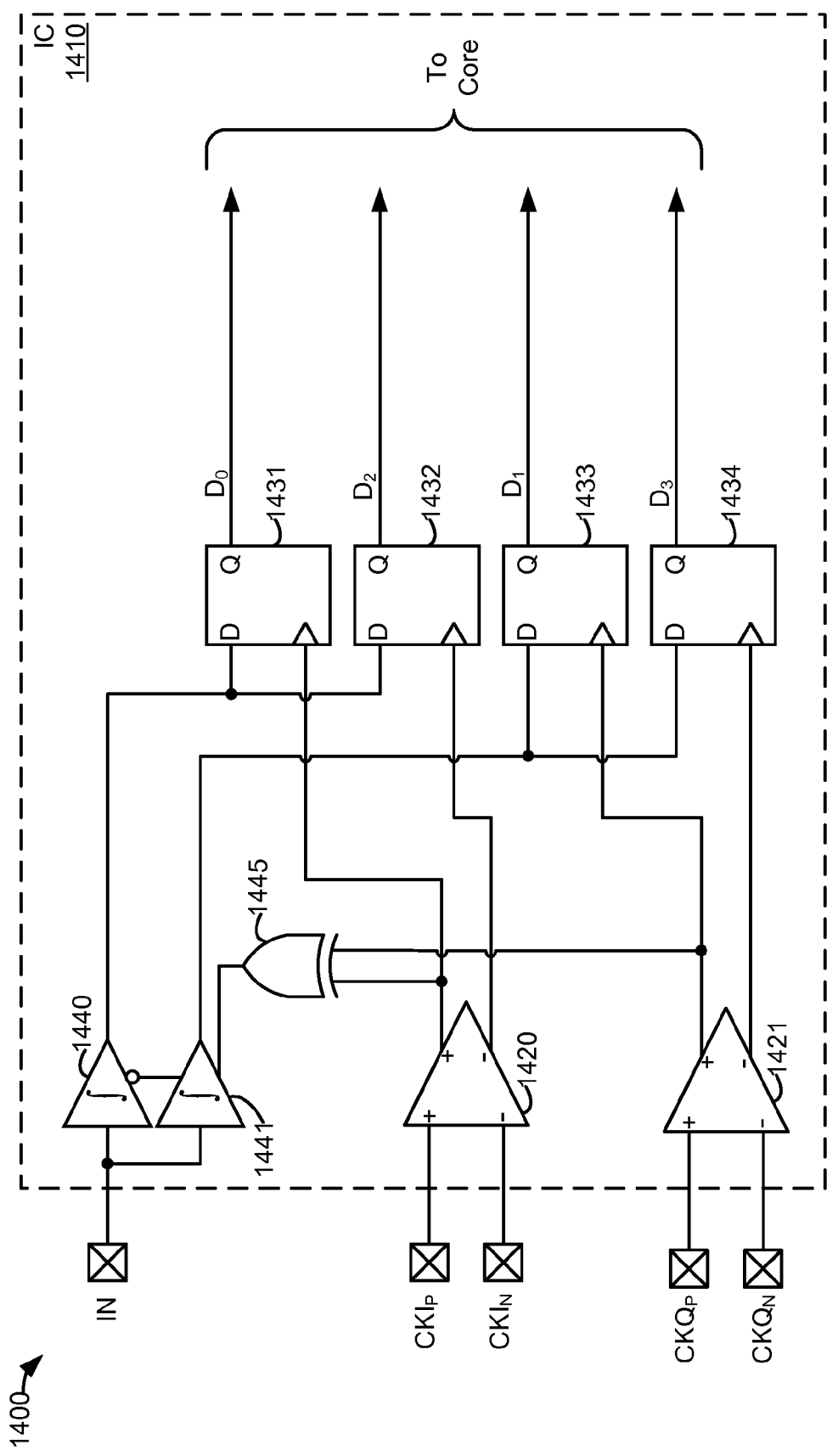
FIG. 14 is a block diagram illustrating a quadrature timed integrating receiver.

FIG. 14 is a block diagram illustrating a quadrature timed integrating receiver. In FIG. 14, integrating receiver 1400 comprises differential signal receiver 1420, differential signal receiver 1421, latches 1431-1434, integrator 1440, integrator 1441, and 2-input exclusive-OR (XOR) gate 1445. Differential receivers 1420-1421, latches 1431-1434, integrators 1440-1441, and XOR 1440 are shown inside integrated circuit (IC) 1410. IC 1410 may correspond to any of the memories or memory controllers discussed previously. Differential signal receivers 1420 and 1421 may correspond to receivers 121 and 122, respectively, shown in FIG. 1. Latches 1431-1434 and integrators 1440 and 1441 may correspond to receivers 123 in FIG. 1.

In FIG. 14, the quadrature timing references CKI and CKQ are shown as differential or complementary signals made of up $CKI_P$ and $CKI_N$, and $CKQ_P$ and $CKQ_N$, respectively. Differential receiver 1420 receives the positive polarity signal $CKI_P$ from outside IC 1410 on its non-inverting input. Differential receiver 1420 receives the negative polarity signal $CKI_N$ from outside IC 1410 on its inverting input. Differential receiver 1421 receives the positive polarity signal $CKQ_P$ from outside IC 1410 on its non-inverting input. Differential receiver 1420 receives the negative polarity signal $CKQ_P$ from outside IC 1410 on its inverting input.

The non-inverting output of differential receiver 1420 is operatively coupled to the clock input of latch 1431 and a first input of XOR 1445. The inverting output of differential receiver 1420 is operatively coupled to the clock input of latch 1432. The non-inverting output of differential receiver 1421 is operatively coupled to the clock input of latch 1433 and the second input of XOR 1445. The inverting output of differential receiver 1421 is operatively coupled to the clock input of latch 1434. It should be understood that the signals on the outputs of differential receivers 1420 and 1421 in FIG. 14 are derived from $CKI_P$, $CKI_N$, $CKQ_P$, and $CKQ_N$ and may include additional buffering, delays, or other modifications to the input signals $CKI_P$, $CKI_N$, $CKQ_P$, or $CKQ_N$.

The output of XOR 1445 is operatively coupled to a positive logic control input of integrator 1440 and a negative logic control input of integrator 1441. In other words, when the output of XOR 1445 is high, integrator 1441 is integrating its input and integrator 1440 is not. Conversely, when the output of XOR 1445 is low, integrator 1440 is integrating its input and integrator 1441 is not. In an embodiment, integrators 1440 and 1441 receive a single-ended input signal, IN, from outside IC 1410. integrators 1440 and 1441 may also receive a voltage reference signal (e.g., VREF, not shown) that is either externally provided or internally generated. In other embodiments, integrators 1440 and 1441 may receive a differential or complementary input signal.

The output of integrator 1440 is operatively coupled to the data (or "D") input of latches 1431 and 1432. The output of integrator 1441 is operatively coupled to the D-input of latches 1433 and 1434. The output of latch 1431 is data bit $D_0$. The output of latch 1432 is data bit $D_2$. The output of latch 1433 is data bit $D_1$. The output of latch 1434 is data bit $D_3$. Data bits $D_0$-$D_3$ are shown as being sent to the core of IC 1410. The core of IC 1410 may include a DRAM core.

In operation, as discussed previously, CKI and CKQ have a quadrature phase relationship to each other. During the first quarter of a cycle, CKI and CKQ are both low. Thus, the non-inverting outputs of differential receivers 1420 and 1421 are both low. This results in XOR 1445 outputting a logic low during the first quarter of a cycle. Thus, during the first quarter of a cycle, integrator 1440 is integrating the signal present on IN and integrator 1441 is not. The rising edge of CKI signals the transition from the first quarter cycle to the second quarter cycle. This also causes a rising edge of the non-inverting output of differential receiver 1420. This rising edge causes latch 1431 to capture the output of integrator 1440. This captured value is output by latch 1431 as data bit $D_0$.

During the second quarter of a cycle, CKI is high and CKQ is low. Thus, the non-inverting outputs of differential receivers 1420 and 1421 have different logic values. This results in XOR 1445 outputting a logic high during the second quarter of a cycle. Thus, during the second quarter of a cycle, integrator 1441 is integrating the signal present on IN and integrator 1440 is not. The rising edge of CKQ signals the transition from the second quarter cycle to the third quarter cycle. This also causes a rising edge of the non-inverting output of differential receiver 1421. This rising edge causes latch 1433 to capture the output of integrator 1441. This captured value is output by latch 1433 as data bit $D_1$.

During the third quarter of a cycle, CKI and CKQ are both high. Thus, the non-inverting outputs of differential receivers 1420 and 1421 have the same logic values. This results in XOR 1445 outputting a logic low during the third quarter of a cycle. Thus, during the third quarter of a cycle, integrator 1440 is integrating the signal present on IN and integrator 1441 is not. The falling edge of CKI signals the transition from the third quarter cycle to the fourth quarter cycle. This also causes a rising edge of the inverting output of differential receiver 1420. This rising edge causes latch 1432 to capture the output of integrator 1440. This captured value is output by latch 1432 as data bit $D_2$.

During the fourth quarter of a cycle, CKI is low and CKQ is high. Thus, the non-inverting outputs of differential receivers 1420 and 1421 have different logic values. This results in XOR 1445 outputting a logic high during the fourth quarter of a cycle. Thus, during the fourth quarter of a cycle, integrator 1441 is integrating the signal present on IN and integrator 1440 is not. The falling edge of CKQ signals the transition from the fourth quarter cycle back to the first quarter cycle. This also causes a rising edge of the inverting output of differential receiver 1421. This rising edge causes latch 1434 to capture the output of integrator 1440. This captured value is output by latch 1434 as data bit $D_3$.

Figure 15:
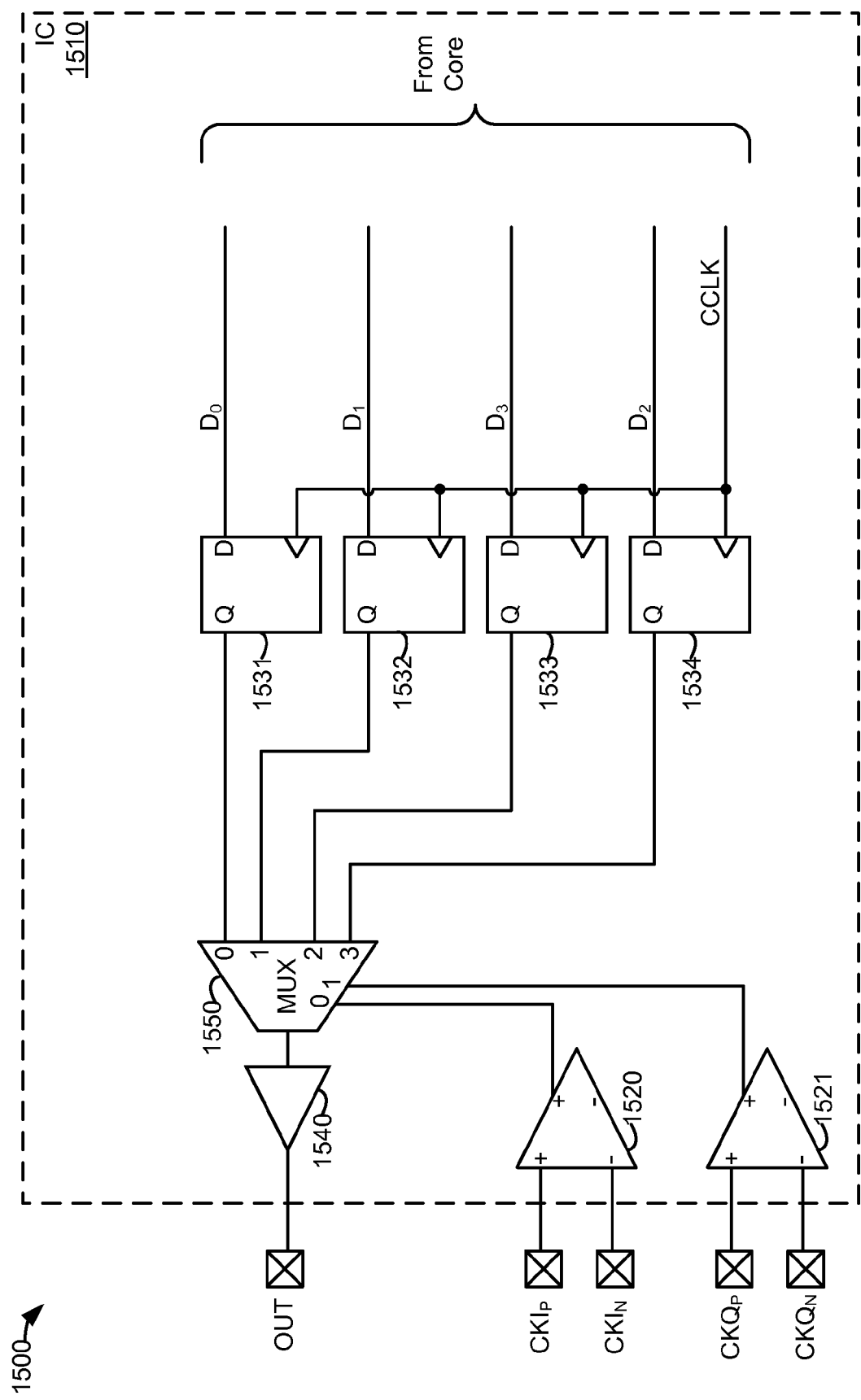
FIG. 15 is a block diagram illustrating a quadrature timed signal driver.

FIG. 15 is a block diagram illustrating a quadrature timed signal driver. In FIG. 15, driver 1500 comprises differential signal receiver 1520, differential signal receiver 1521, latches 1531-1534, 4:1 multiplexor (MUX) 1550, and output driver 1540. Differential receivers 1520-1521, latches 1531-1534, MUX 1550, and output driver 1540 are shown inside integrated circuit (IC) 1510. IC 1510 may correspond to any of the memories or memory controllers discussed previously.

In FIG. 15, the quadrature timing references CKI and CKQ are shown as differential or complementary signals made of up $CKI_P$ and $CKI_N$, and $CKQ_P$ and $CKQ_N$, respectively. Differential receiver 1520 receives the positive polarity signal $CKI_P$ from outside IC 1510 on its non-inverting input. Differential receiver 1520 receives the negative polarity signal $CKI_N$ from outside IC 1510 on its inverting input. Differential receiver 1521 receives the positive polarity signal $CKQ_P$ from outside IC 1510 on its non-inverting input. Differential receiver 1520 receives the negative polarity signal $CKQ_P$ from outside IC 1510 on its inverting input.

The data inputs to latches 1531-1534 are data bits $D_0$-$D_3$, respectively, which are received from the core of IC 1510. Data bits $D_0$-$D_3$ are captured by latches 1531-1534 under the control of a clock (CCLK) also received from the core of IC 1510.

The non-inverting output of differential receiver 1520 is connected to MUX control input "0". The non-inverting output of differential receiver 1521 is connected to MUX control input "1". The "0" input of MUX 1550 receives the output of latch 1531. The "1" input of MUX 1550 receives the output of latch 1532. The "2" input of MUX 1550 receives the output of latch 1533. The "3" input of MUX 1550 receives the output of latch 1531. The output of MUX 1550 is operatively coupled to the input of output driver 1540. The output of output driver 1540 drives the off-chip signal OUT. Accordingly, the state of CKI and CKQ, to the output of MUX 1550 (and thus, OUT), is given according to Table 3.

TABLE 3

| CKI | CKQ | OUT |
|-----|-----|-----|
| 0 | 0 | $D_0$ |
| 1 | 0 | $D_1$ |
| 1 | 1 | $D_2$ |
| 0 | 1 | $D_3$ |

In operation, as discussed previously, CKI and CKQ have a quadrature phase relationship to each other. During the first quarter of a cycle, CKI and CKQ are both low. Thus, the control inputs to MUX 1550 are both low. This results in MUX 1550 outputting the value on its "0" input during the first quarter of a cycle. The value on MUX 1550's "0" data input is the output of latch 1531, $D_0$. Thus, the signal output by output driver 1540 during the first quarter cycle corresponds to $D_0$.

During the second quarter of a cycle, CKI is high and CKQ is low. Thus, the "0" control input to MUX 1550 is high and the "1" control input is low. This results in MUX 1550 outputting the value on its "1" input during the second quarter of a cycle. The value on MUX 1550's "1" data input is the output of latch 1532, $D_1$. Thus, the signal output by output driver 1540 during the second quarter cycle corresponds to $D_1$. During the third quarter of a cycle, CKI and CKQ are both high. Thus, the control inputs to MUX 1550 are both high. This results in MUX 1550 outputting the value on its "3" input during the third quarter of a cycle. The value on MUX 1550's "3" data input is the output of latch 1534, $D_2$. Thus, the signal output by output driver 1540 during the third quarter cycle corresponds to $D_2$. During the fourth quarter of a cycle, CKI is low and CKQ is high. Thus, the "0" control input to MUX 1550 is low and the "1" control input is high. This results in MUX 1550 outputting the value on its "2" input during the fourth quarter of a cycle. The value on MUX 1550's "2" data input is the output of latch 1533, $D_3$. Thus, the signal output by output driver 1540 during the fourth quarter cycle corresponds to $D_3$.

Figure 16:
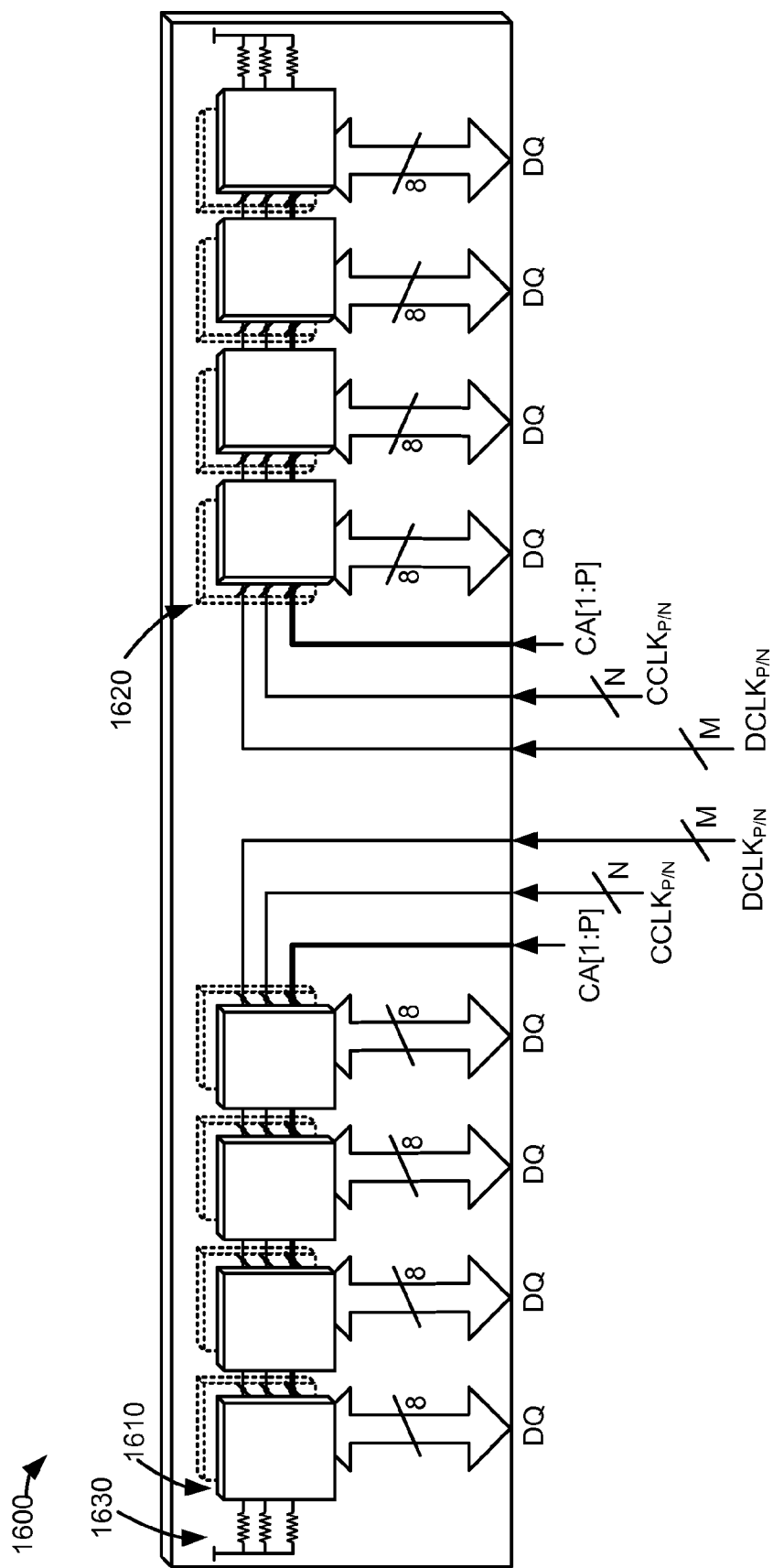
FIG. 16 is an illustration of a 4-drop, 2-rank memory module.

FIG. 16 is an illustration of a 4-drop, 2-rank memory module. As can be seen in FIG. 16, a first rank of eight memory devices 1610 is on one side of the module (shown in solid line) and a second rank of eight memory devices 1620 is on the other (shown in dotted line). In FIG. 16, each memory device outputs 8 data bits (DQ's). A command/address bus of P number of signals (CA[1:1]), a differential set of command/address timing references (CCLK$_{P/N}$) of N number of differential signals, and data timing references of M number of differential signals (DCLK$_{P/N}$) are routed in a fly-by topology to the first rank of memory devices 1610 and the second rank of memory device 1620. These busses/references (i.e., CA[1:P], CCLK$_{P/N}$, and DCLK$_{P/N}$) are terminated on the module by termination 1630. In an embodiment, one or more of N=2 and/or M=2 and thus at least of CCLK$_{P/N}$ and/or DCLK$_{P/N}$ is quadrature timed.

Figure 17:
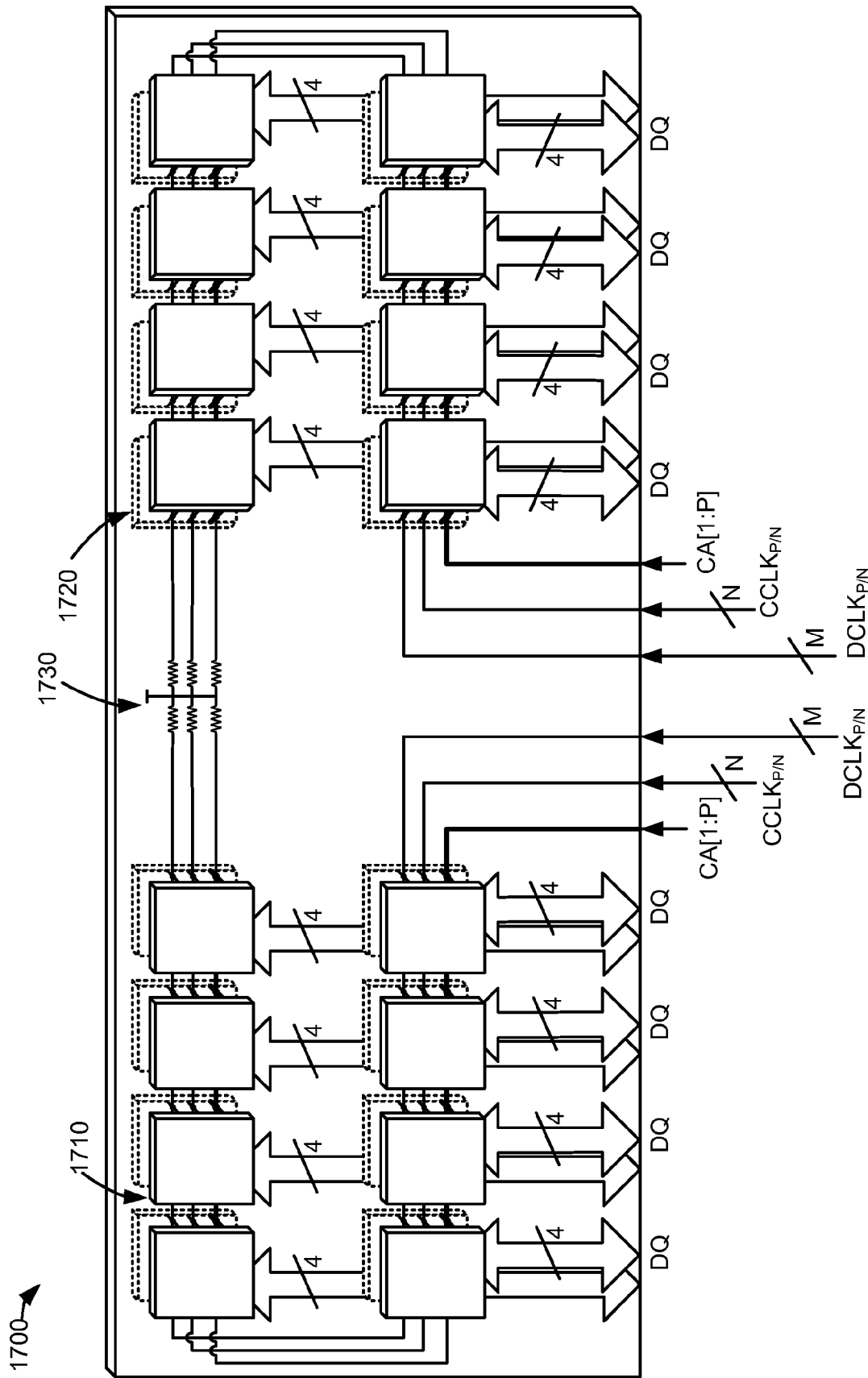
FIG. 17 is an illustration of an 8-drop, 2-rank memory module.

FIG. 17 is an illustration of an 8-drop, 2-rank memory module. As can be seen in FIG. 17, a first rank of sixteen memory devices 1710 (shown in solid line) is on one side of the module arranged in two rows. A second rank of sixteen memory devices 1620 is on the other (shown in dotted line). In FIG. 17, each memory device outputs 4 data bits (DQ's). A command/address bus of P number of signals (CA[1:P]), a differential set of command/address timing references (CCLK$_{P/N}$) of N number of differential signals, and data timing references of M number of differential signals (DCLK$_{P/N}$) are routed in a fly-by topology to the first rank of memory devices 1710 and the second rank of memory device 1720. These busses/references (i.e., CA[1:P], CCLK$_{P/N}$, and DCLK$_{P/N}$) are terminated on the module by termination 1730. In an embodiment, one or more of N=2 and/or M=2 and thus at least of CCLK$_{P/N}$ and/or DCLK$_{P/N}$ is quadrature timed.

Figure 18:
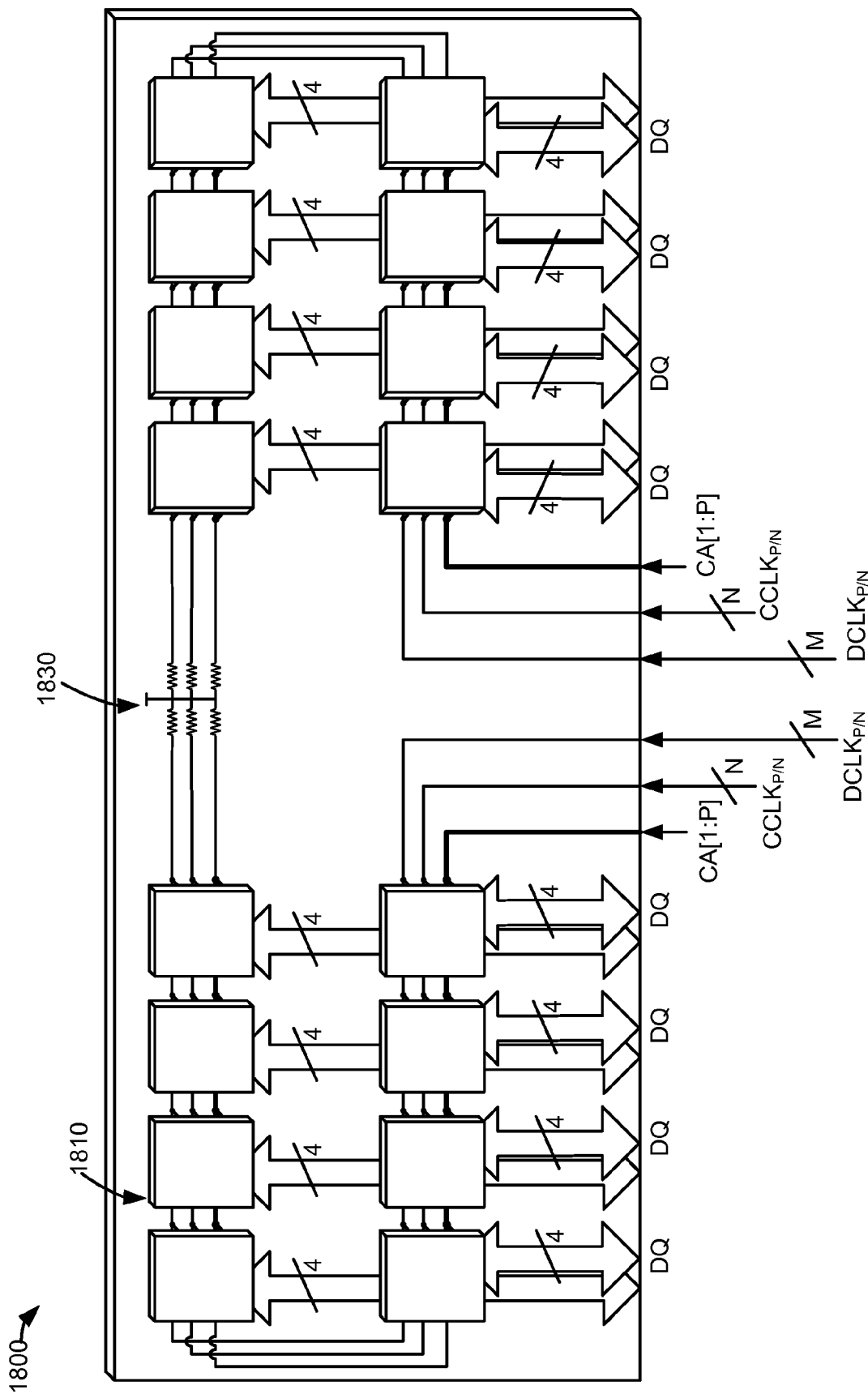
FIG. 18 is an illustration of an 8-drop, 1-rank memory module.

FIG. 18 is an illustration of an 8-drop, 1-rank memory module. As can be seen in FIG. 18, a rank of sixteen memory devices 1810 is on one side of the module arranged in two rows. In FIG. 18, each memory device outputs 4 data bits (DQ's). A command/address bus of P number of signals (CA[1:1]), a differential set of command/address timing references (CCLK$_{P/N}$) of N number of differential signals, and data timing references of M number of differential signals (DCLK$_{P/N}$) are routed in a fly-by topology to the memory devices 1810. These busses/references (i.e., CA[1:P], CCLK$_{P/N}$, and DCLK$_{P/N}$) are terminated on the module by termination 1830. In an embodiment, one or more of N=2 and/or M=2 and thus at least of CCLK$_{P/N}$ and/or DCLK$_{P/N}$ is quadrature timed.

The methods, systems and devices described above may be implemented in computer systems, or stored by computer systems. The methods described above may also be stored on a computer readable medium. Devices, circuits, and systems described herein may be implemented using computer-aided design tools available in the art, and embodied by computer-readable files containing software descriptions of such circuits. This includes, but is not limited to memory systems 100, 400, 600, 900, 1000, 1100, and 1200, sampling receiver 1300, integrating receiver 1400, driver 1500, and memory modules 1600, 1700, and 1800, and their components. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 19:
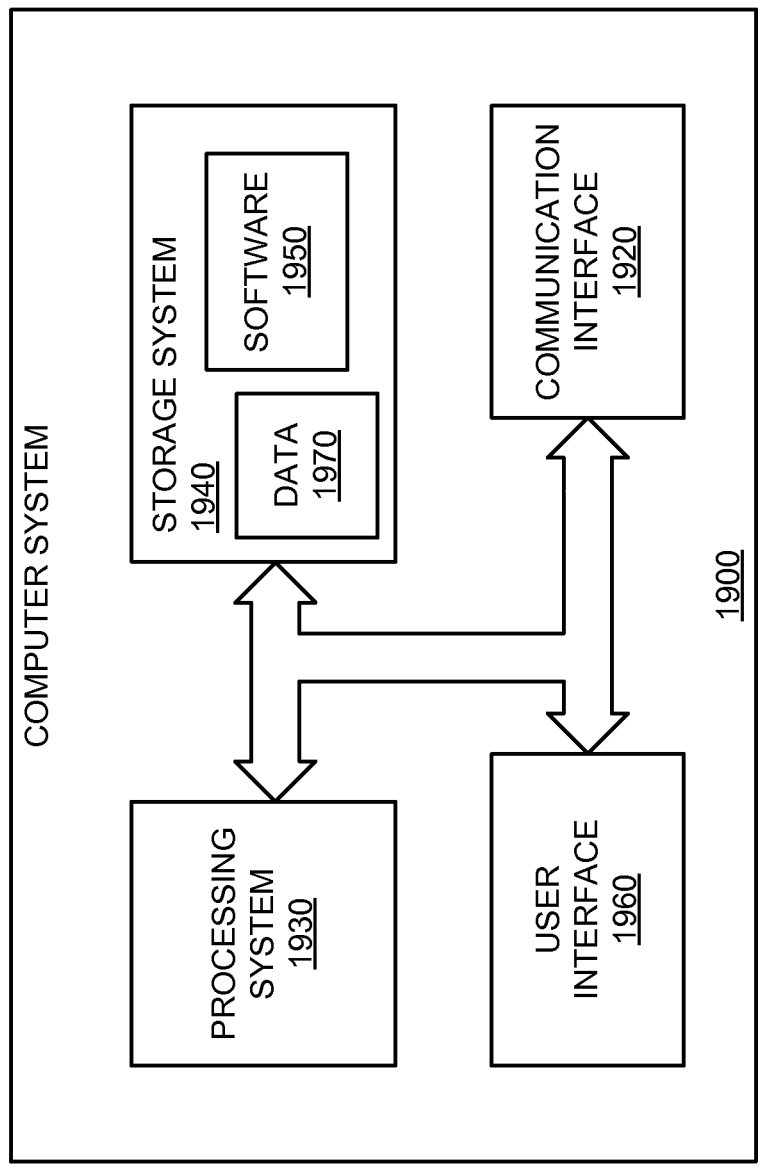
FIG. 19 is a block diagram of a computer system.

FIG. 19 illustrates a block diagram of a computer system. Computer system 1900 includes communication interface 1920, processing system 1930, storage system 1940, and user interface 1960. Processing system 1930 is operatively coupled to storage system 1940. Storage system 1940 stores software 1950 and data 1970. Storage system 1940 may include one or more of memory systems memory systems 100, 400, 600, 900, 1000, 1100, and 1200, sampling receiver 1300, integrating receiver 1400, driver 1500, and memory modules 1600, 1700, and 1800. Processing system 1930 is operatively coupled to communication interface 1920 and user interface 1960. Computer system 1900 may comprise a programmed general-purpose computer. Computer system 1900 may include a microprocessor. Computer system 1900 may comprise programmable or special purpose circuitry. Computer system 1900 may be distributed among multiple devices, processors, storage, and/or interfaces that together comprise elements 1920-1970.

Communication interface 1920 may comprise a network interface, modem, port, bus, link, transceiver, or other communication device. Communication interface 1920 may be distributed among multiple communication devices. Processing system 1930 may comprise a microprocessor, microcontroller, logic circuit, or other processing device. Processing system 1930 may be distributed among multiple processing devices. User interface 1960 may comprise a keyboard, mouse, voice recognition interface, microphone and speakers, graphical display, touch screen, or other type of user interface device. User interface 1960 may be distributed among multiple interface devices. Storage system 1940 may comprise a disk, tape, integrated circuit, RAM, ROM, EEPROM, flash memory, network storage, server, or other memory function. Storage system 1940 may include computer readable medium. Storage system 1940 may be distributed among multiple memory devices.

Processing system 1930 retrieves and executes software 1950 from storage system 1940. Processing system may retrieve and store data 1970. Processing system may also retrieve and store data via communication interface 1920. Processing system 1950 may create or modify software 1950 or data 1970 to achieve a tangible result. Processing system may control communication interface 1920 or user interface 1970 to achieve a tangible result. Processing system may retrieve and execute remotely stored software via communication interface 1920.

Software 1950 and remotely stored software may comprise an operating system, utilities, drivers, networking software, and other software typically executed by a computer system. Software 1950 may comprise an application program, applet, firmware, or other form of machine-readable processing instructions typically executed by a computer system. When executed by processing system 1930, software 1950 or remotely stored software may direct computer system 1900 to operate as described herein.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A memory device, comprising:
    a first circuit to receive a first external timing reference signal;
    a second circuit to receive a second external timing reference signal, the second timing reference signal to have a quadrature phase relationship with respect to the first timing reference signal; and,
    a plurality of receiver circuits to receive signals synchronously with respect to the first external timing reference signal and the second external timing reference signal, such that a first signal value is resolved using the first external timing reference signal and a second signal value is resolved using the second external timing reference signal.

2. The memory device of claim 1, wherein the first signal value is to be received during a first interval.

3. The memory device of claim 1, wherein the first external timing reference signal and the second external timing reference signal are clock signals.

4. The memory device of claim 1, wherein said quadrature phase relationship comprises a first edge of said first external timing reference signal occurring approximately halfway between a first edge of said second external timing reference signal and a successive second edge of said second external timing reference signal.

5. The memory device of claim 1, wherein the first external timing reference signal and the second external timing reference signal are strobe signals.

6. The memory device of claim 1 wherein the first signal value is to be received during a first interval and the first interval is defined based on a first edge of the first external timing reference signal and an edge of the second external timing reference signal that succeeds the first edge and a first of the plurality of receiver circuits integrates over the first interval to resolve the first signal value.

7. The memory device of claim 1 wherein a first receiver circuit of the plurality of receiver circuits samples a signal using the first external timing reference signal to resolve the first signal value.

8. A memory controller, comprising:
    a first transmitter circuit to output a first timing reference signal to a plurality of memory devices;
    a second transmitter circuit to transmit a second timing reference signal to the plurality of memory devices, the second timing reference signal to have a quadrature phase relationship with respect to the first timing reference signal; and,
    a third transmitter circuit to transmit signals to the plurality of memory devices via respective signal paths, the transmitted signals to have a timing relationship to the first timing reference signal and the second timing reference signal such that when the first timing reference signal, the second timing reference signal, and the transmitted signals arrive at the plurality of memory devices a first signal value of the transmitted signals is to resolve using the first timing reference signal and a second signal value of the transmitted signals is to resolve using the second timing reference signal.

9. The memory controller of claim 8, wherein a first transmitted signal is transmitted to a first memory device of the plurality of memory devices and a second transmitted signal is transmitted to a second of the plurality of memory devices, the first timing reference signal to take a first propagation time to propagate from the memory controller to the first memory device and a second propagation time to propagate from the memory controller to the second memory device, the first propagation time being different from the second propagation time, a first transmit time for the first transmitted signal being to be based on the first propagation time and a second transmit time for the second transmitted signal to be based on the second propagation time.

10. The memory controller of claim 8 wherein the first timing reference signal and the second timing reference signal are clock signals.

11. The memory controller of claim 8 wherein the first timing reference signal and the second timing reference signal are strobe signals.

12. A method of operating a memory controller, comprising:
- outputting a first timing reference signal that is periodic at a frequency;
- outputting a second timing reference signal that is periodic at the frequency of the first timing reference signal, the second timing reference signal being delayed by an interval after the first timing reference signal, wherein the interval is less than one-half a cycle time of the frequency of the first timing reference signal;
- receiving a first data bit from a first memory device at a first time synchronously with respect to a first internal clock signal derived from the first timing reference signal; and,
- receiving a second data bit from a second memory device at a second time synchronously with respect to a second internal clock signal derived from the first timing reference signal, the first time and the second time being different.

13. The method of claim 12, wherein said interval corresponds to a bit time of said first data bit.

14. The method of claim 12, further comprising:
- receiving a third data bit from the first memory device at a third time synchronously with respect the first internal clock signal; and,
- receiving a fourth data bit from the second memory device at a fourth time synchronously with respect to the second internal clock signal, the third time and the fourth time being different.

15. The method of claim 14, wherein the first data bit from the first memory device is output by the first memory device in response to a first edge of the first timing reference signal and the third data bit from the first memory device is output by the first memory device in response to a second edge of the second timing reference signal.

16. The method of claim 14, further comprising:
- stopping the periodicity of the first timing reference signal and the second timing reference signal; and
- resuming the periodicity of the first timing reference signal and the second timing reference signal.

17. A method of operating a memory device, comprising:
- receiving a first external timing reference signal;
- receiving a second external timing reference signal, the second timing reference signal having a quadrature phase relationship with respect to the first timing reference signal; and,
- receiving a plurality of signals synchronously with respect to the first timing reference signal and the second timing reference signal, such that a first signal value is resolved using the first timing reference signal and a second signal value is resolved using the second timing reference signal.

18. The method of claim 17, wherein the first external timing reference signal and the second external timing reference signal are clock signals.

19. The method of claim 17, wherein the first signal value is received during a first interval and the first interval is defined based on a first edge of the first external timing reference signal and an edge of the second external timing reference signal that succeeds the first edge and a first of the plurality of receiver circuits integrate over the first interval to resolve the first signal value.

20. The method of claim 17 wherein a first receiver circuit of the plurality of receiver circuits samples a signal using the first external timing reference signal to resolve the first signal value.

* * * * *